United States Patent
Oshima

(10) Patent No.: US 12,432,947 B2
(45) Date of Patent: Sep. 30, 2025

(54) SEMICONDUCTOR DEVICE AND METHOD OF MANUFACTURING SEMICONDUCTOR DEVICE

(71) Applicant: FLOSFIA INC., Kyoto (JP)

(72) Inventor: Takayoshi Oshima, Kyoto (JP)

(73) Assignee: FLOSFIA INC., Kyoto (JP)

( * ) Notice: Subject to any disclaimer, the term of this patent is extended or adjusted under 35 U.S.C. 154(b) by 425 days.

(21) Appl. No.: 17/874,977

(22) Filed: Jul. 27, 2022

(65) Prior Publication Data

US 2022/0367674 A1    Nov. 17, 2022

Related U.S. Application Data

(63) Continuation-in-part of application No. PCT/JP2021/002822, filed on Jan. 27, 2021.

(30) Foreign Application Priority Data

Jan. 27, 2020  (JP) .................................. 2020-010924
Jan. 27, 2020  (JP) .................................. 2020-010925

(Continued)

(51) Int. Cl.
*H10D 8/60*       (2025.01)
*C23C 16/04*      (2006.01)
(Continued)

(52) U.S. Cl.
CPC ............. *H10D 8/051* (2025.01); *C23C 16/04* (2013.01); *C30B 29/16* (2013.01); *H10D 8/60* (2025.01); *H10D 64/62* (2025.01)

(58) Field of Classification Search
CPC . H01L 29/45; H01L 29/66143; H01L 29/872; H01L 21/02483; H01L 21/02565;
(Continued)

(56) References Cited

U.S. PATENT DOCUMENTS 10,497,726 B2 * 12/2019 Fujimaki ............ H01L 27/1443
2001/0040246 A1 * 11/2001 Ishii ................... H01L 29/66522
257/E21.441

(Continued)

FOREIGN PATENT DOCUMENTS

CN    103367420    10/2013
JP    10-312971    11/1998
(Continued)

OTHER PUBLICATIONS

International Search Report dated Apr. 6, 2021 in corresponding International Application No. PCT/JP2021/002822.
(Continued)

*Primary Examiner* — Monica D Harrison
(74) *Attorney, Agent, or Firm* — Wenderoth, Lind & Ponack, L.L.P.

(57) ABSTRACT

A semiconductor device includes: a semiconductor film including a Schottky junction region and an Ohmic junction region; a Schottky electrode arranged on the Schottky junction region; and an Ohmic electrode arranged on the Ohmic junction region, the Schottky junction region having a first dislocation density, the Ohmic junction region having a second dislocation region, and the first dislocation density being smaller than the second dislocation density.

14 Claims, 16 Drawing Sheets

(30) Foreign Application Priority Data

Jan. 27, 2020 (JP) .................................. 2020-010926
Jan. 27, 2020 (JP) .................................. 2020-010927

(51) Int. Cl.

| | | |
|---|---|---|
| C30B 29/16 | (2006.01) | |
| H10D 8/01 | (2025.01) | |
| H10D 64/62 | (2025.01) | |

(58) Field of Classification Search

CPC ......... H01L 21/02516; H01L 21/02518; H01L 21/02521; H01L 21/02554; C30B 29/16; C23C 16/04; C23C 16/40; C23C 16/407; H10D 8/051; H10D 8/60; H10D 64/62
USPC ....................................................... 257/295
See application file for complete search history.

(56) References Cited

U.S. PATENT DOCUMENTS

| | | | |
|---|---|---|---|
| 2002/0066403 A1 | 6/2002 | Sunakawa et al. | |
| 2003/0119239 A1 | 6/2003 | Koike et al. | |
| 2014/0061846 A1* | 3/2014 | Kanematsu | H01L 29/861 257/471 |
| 2014/0138705 A1 | 5/2014 | Zhang et al. | |
| 2015/0021616 A1* | 1/2015 | Lee | H01L 29/7787 257/76 |
| 2015/0194479 A1 | 7/2015 | Kaneko et al. | |
| 2015/0225843 A1 | 8/2015 | Oda et al. | |
| 2019/0055667 A1 | 2/2019 | Oshima et al. | |
| 2019/0057865 A1 | 2/2019 | Oshima et al. | |
| 2019/0067492 A1 | 2/2019 | Sugimoto et al. | |

FOREIGN PATENT DOCUMENTS

| | | |
|---|---|---|
| JP | 2001-284266 | 10/2001 |
| JP | 2003-332563 | 11/2003 |
| JP | 5343224 | 11/2013 |
| JP | 2014-5189 | 1/2014 |
| JP | 5397794 | 1/2014 |
| JP | 5397795 | 1/2014 |
| JP | 2014-49616 | 3/2014 |
| JP | 2014-72533 | 4/2014 |
| JP | 2016-502761 | 1/2016 |
| JP | 2016-98166 | 5/2016 |
| JP | 2016-100592 | 5/2016 |
| JP | 2016-100593 | 5/2016 |
| JP | 2016-155714 | 9/2016 |
| JP | 2018-002544 | 1/2018 |
| JP | 2019-34883 | 3/2019 |
| KR | 10-2005-0085925 | 8/2005 |
| WO | 2014/050793 | 4/2014 |
| WO | 2019/031204 | 2/2019 |

OTHER PUBLICATIONS

Kentaro Kaneko, "Growth and physical properties of corundum-structured gallium oxide allow thin films", Dissertation, Kyoto Univ., Mar. 2013, pp. 1-116, w/English Abstract.

Partial Supplementary European Search Report issued Jan. 24, 2024 in European Patent Application No. 21747504.5.

Hoki Son et al., "Crystal Quality Improvement of $\alpha$-$Ga_2O_3$ Growth on Stripe Patterned Template via Epitaxial Lateral Overgrowth", Crystal Growth & Design, 2019, vol. 19, No. 9 pp. 5105-5110.

Request for the Submission of an Opinion issued Apr. 25, 2024 in corresponding Korean Patent Application No. 10-2022-7028027, with English translation.

First Office Action issued Jun. 20, 2025 in corresponding Chinese Patent Application No. 202180011241.4, with English-language translation.

\* cited by examiner

FIG. 15-a
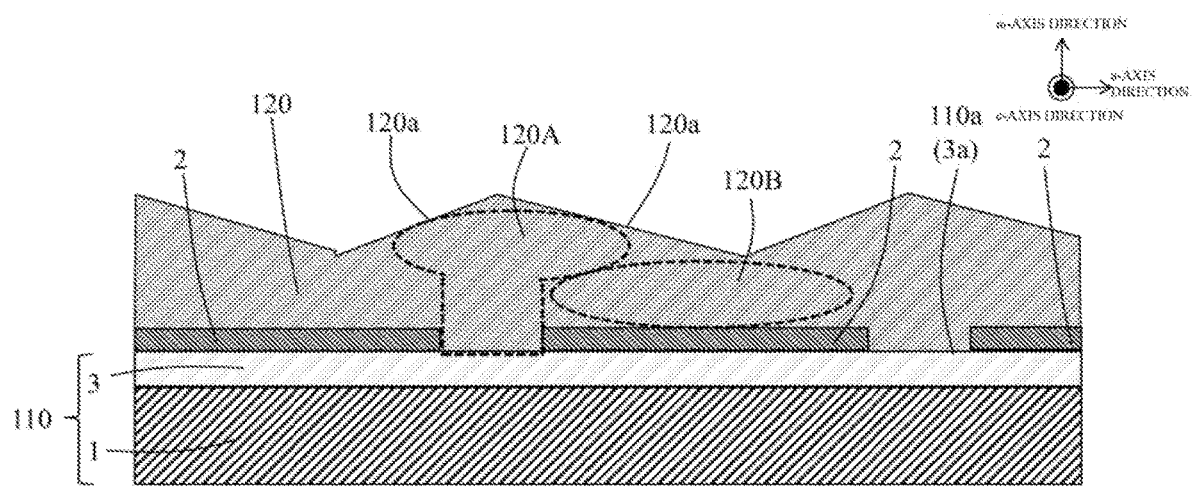
FIG. 15-b
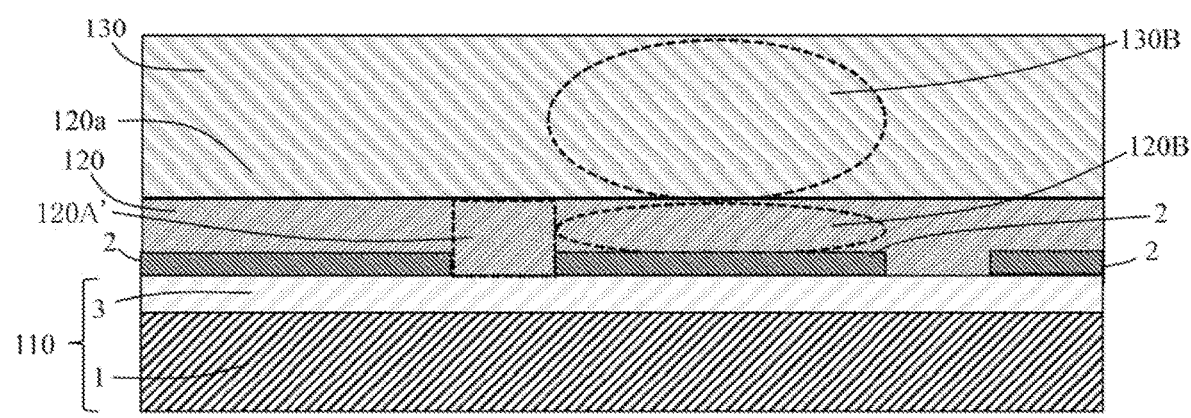

FIG. 16-a
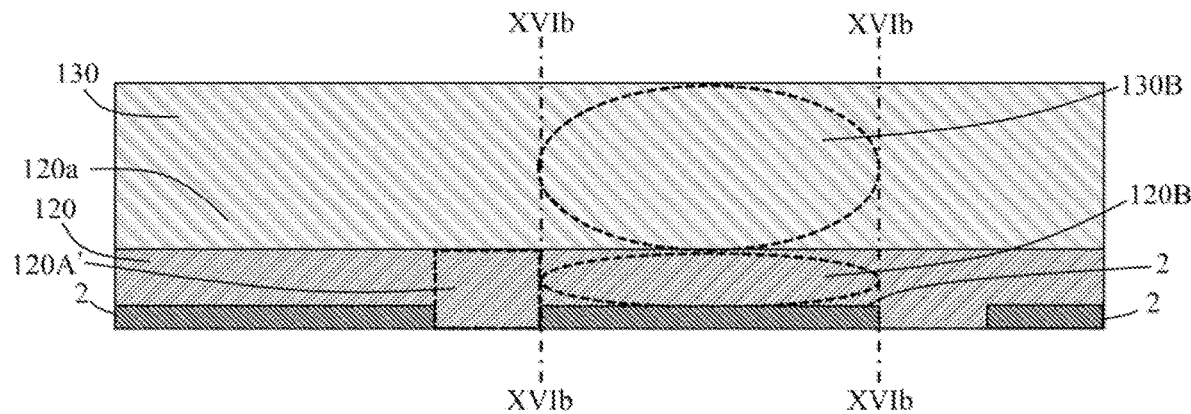
FIG. 16-b
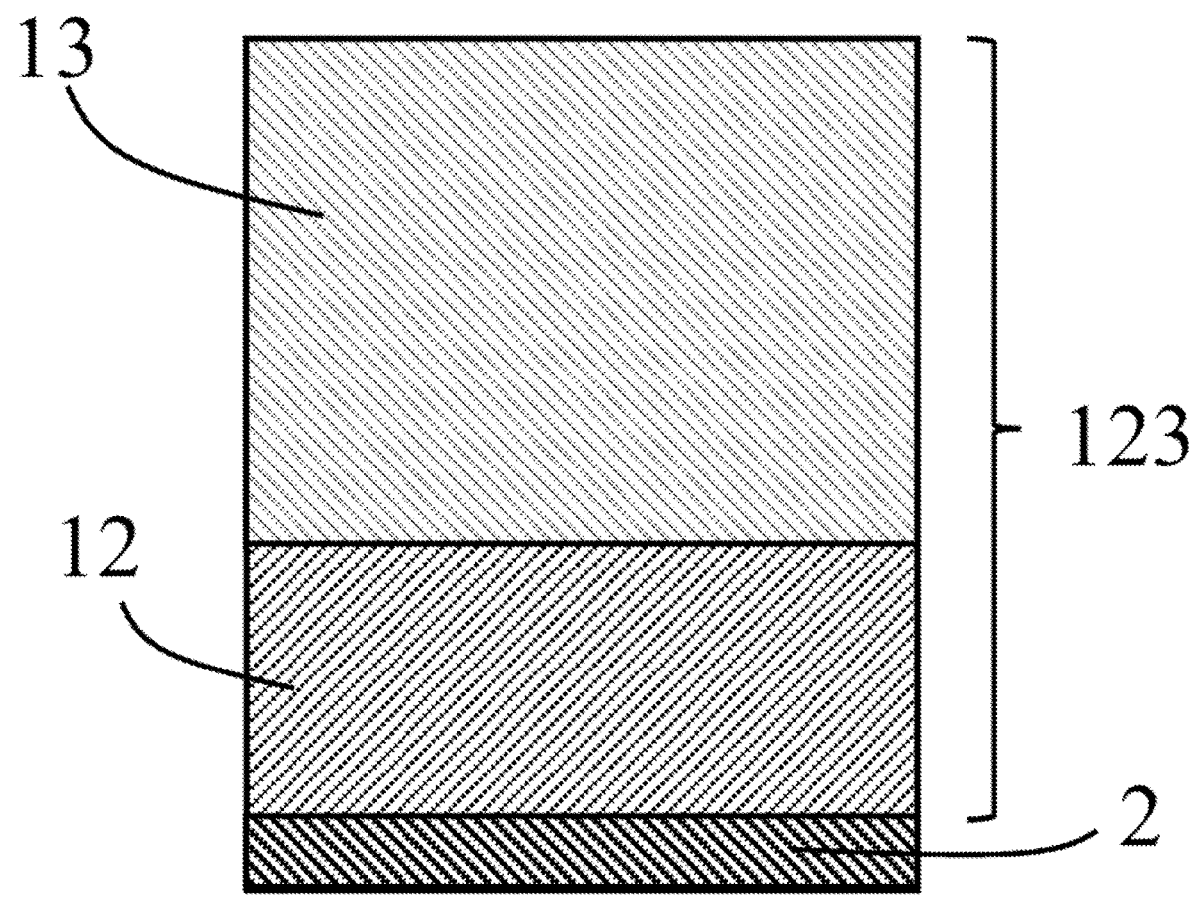

FIG. 17-a
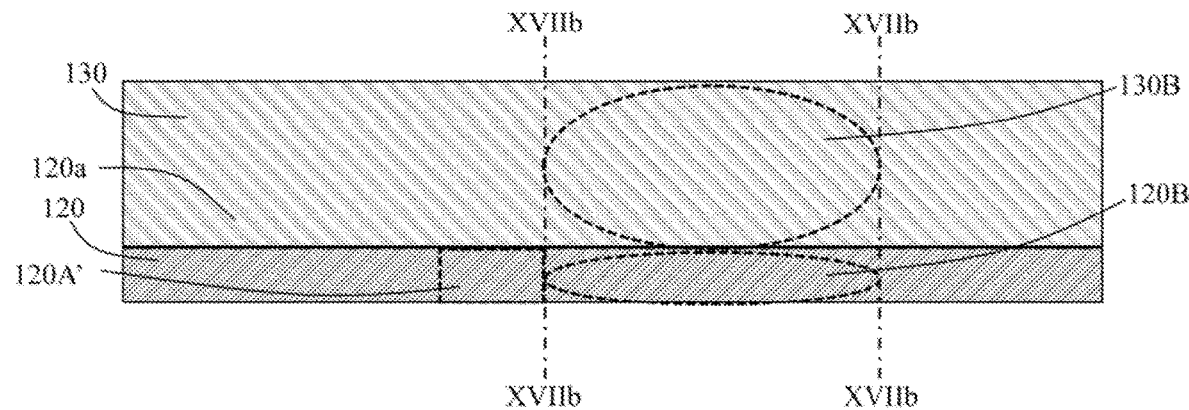
FIG. 17-b
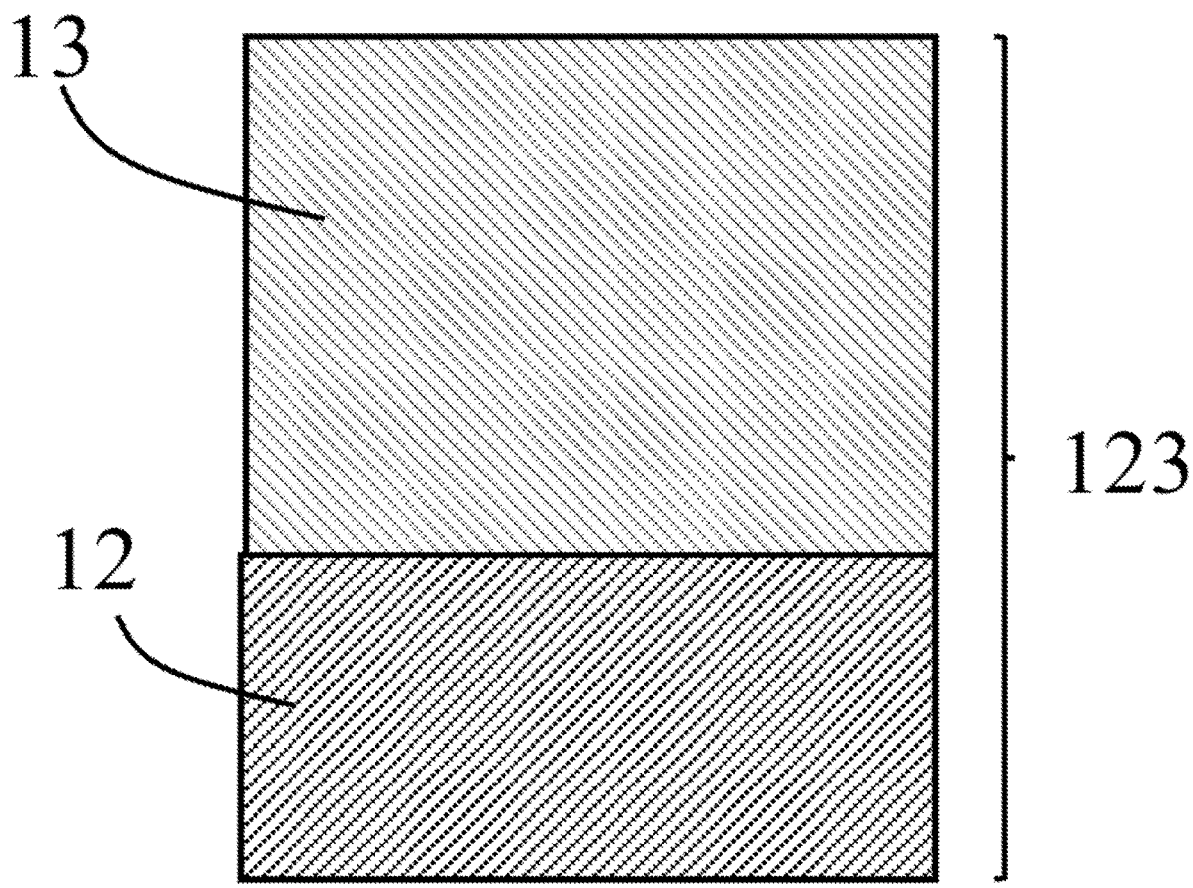

FIG. 17-c
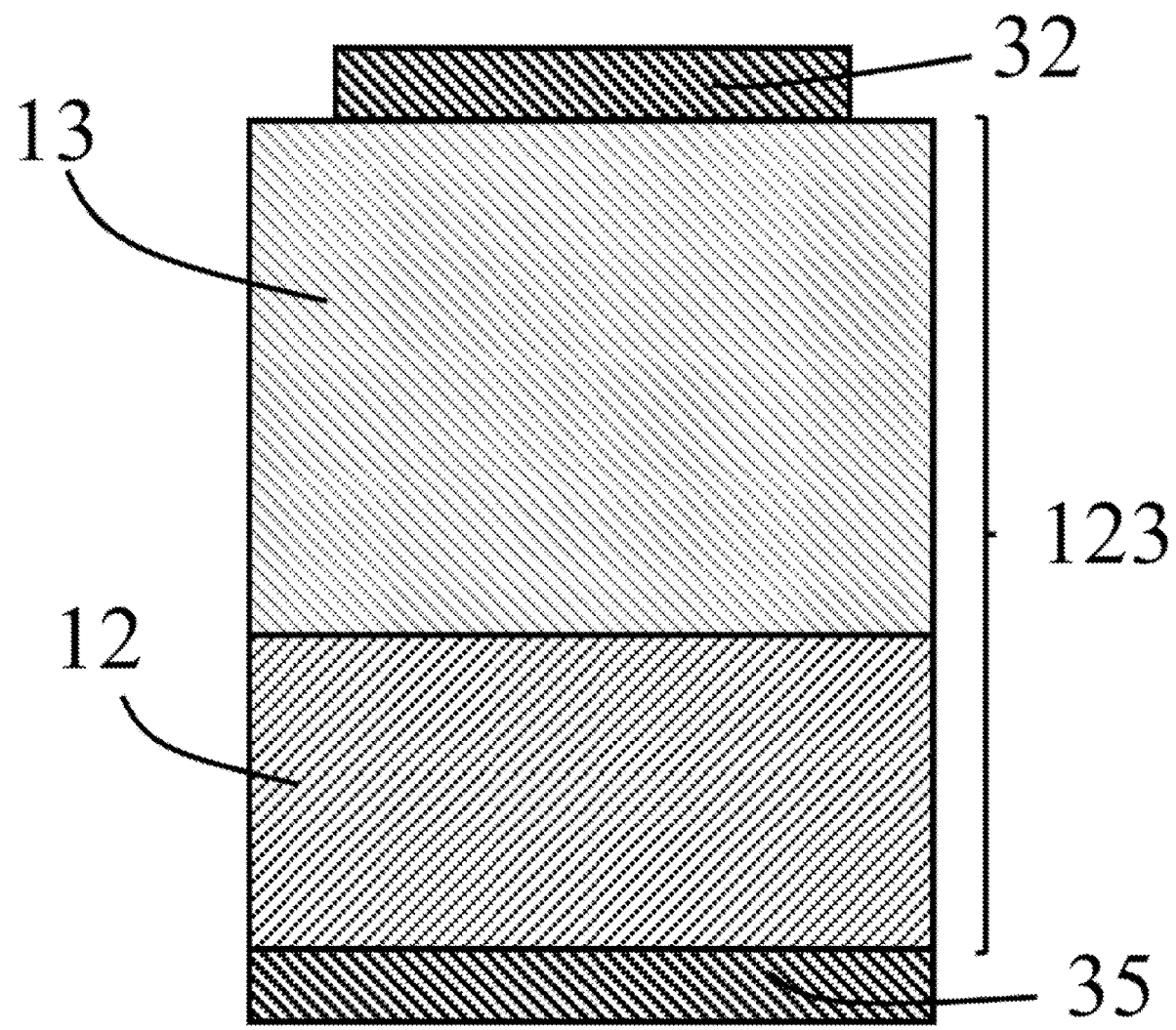

SEMICONDUCTOR DEVICE AND METHOD OF MANUFACTURING SEMICONDUCTOR DEVICE

CROSS REFERENCE TO RELATED APPLICATION

This application is a continuation-in-part application of International Patent Application No. PCT/JP2021/002822 (Filed on Jan. 27, 2021), which claims the benefit of priority from Japanese Patent Application No. 2020-010924 (filed on Jan. 27, 2020), No. 2020-010925 (filed on Jan. 27, 2020), No. 2020-010926 (filed on Jan. 27, 2020), and No. 2020-010927 (filed on Jan. 27, 2020).

The entire contents of the above applications, which the present application is based on, are incorporated herein by reference.

FIELD OF THE INVENTION

The disclosure relates to a semiconductor device useful, for example, for power devices. The disclosure also relates to a method of manufacturing a semiconductor device.

DESCRIPTION OF THE RELATED ART

Attention has been focused on a semiconductor device using gallium oxide ($Ga_2O_3$) having a wide band gap functioning as a next-generation switching element capable of achieving a high withstand voltage, low loss, and high resistance to heat. Application to a power semiconductor device such as an inverter is expected.

Furthermore, the wide band gap is also expected to provide a wide range of applied use as a light emitting and receiving device such as an LED or a sensor. In particular, gallium oxide having a corundum structure such as $\alpha$-$Ga_2O_3$ becomes controllable in band gap by using indium or aluminum alone, or a mixed crystal of indium and aluminum and forms an extremely attractive family of materials as InAlGaO-based semiconductors. Here, the InAlGaO-based semiconductors indicate $In_X Al_Y Ga_Z O_3$ ($0 \leq X \leq 2$, $0 \leq Y \leq 2$, $0 \leq Z \leq 2$, $X+Y+Z=1.5$ to $2.5$) (PTL 9, etc.) and may be regarded as a family of materials including gallium oxide.

However, as gallium oxide has a $\beta$-Gallia structure in the most stable phase, depositing a crystal film having a corundum structure as a metastable phase is difficult unless a particular deposition method is used. In many cases, conditions for crystal growth are restricted on heteroepitaxial growth, for example, leading to a tendency toward higher dislocation density. Furthermore, many problems are still left not only in a crystal film having a corundum structure but also in improvements in deposition rate and crystal quality, prevention of cracks and abnormal growth, twin prevention, and a fracture in a substrate due to warpage.

A method of manufacturing an oxide crystal thin film by mist CVD method using bromide or iodide of gallium or indium is known. A multilayer structure in which a semiconductor layer having a corundum crystal structure and an insulating film having a corundum crystal structure are stacked on a base substrate having a corundum crystal structure is known. Deposition by mist CVD using an ELO substrate or void formation has also been examined.

Deposition of gallium oxide having a corundum structure by halide vapor phase epitaxy method (HVPE method) using at least a gallium raw material and an oxygen raw material is known. Formation of a crystal film having a surface area of equal to or greater than 9 $\mu m^2$ and having dislocation density of $5 \times 10^6/cm^2$ through ELO crystal growth using a PSS substrate is known.

SUMMARY OF THE INVENTION

According to an example of the present disclosure, there is provided a semiconductor device including: a semiconductor film including a Schottky junction region and an Ohmic junction region; a Schottky electrode arranged on the Schottky junction region; and an Ohmic electrode arranged on the Ohmic junction region, the Schottky junction region having a first dislocation density, the Ohmic junction region having a second dislocation region, and the first dislocation density being smaller than the second dislocation density.

According to an example of the present disclosure, there is provided a semiconductor device including: a semiconductor film including a channel layer and an $n^+$-type semiconductor layer; and a gate electrode that is arranged directly or via another layer on the channel layer, the channel layer having a first dislocation density, the $n^+$-type semiconductor layer having a second dislocation density, and the first dislocation density is smaller than the second dislocation density.

According to an example of the present disclosure, there is provided a method of manufacturing a semiconductor device including: arranging a mask on a crystal substrate directly or via a crystal layer in such a manner that the mask extends lengthwise in a direction conforming to a c-axis direction of the crystal substrate; and causing crystal growth of a semiconductor film on the crystal substrate on which the mask is arranged.

According to an example of the present disclosure, there is provided a method of manufacturing a semiconductor device including: arranging a mask on a crystal substrate directly or via a crystal layer; causing crystal growth of a semiconductor film on the crystal substrate on which the mask is arranged; using the mask as an electrode or a gate insulating layer.

Thus, a semiconductor device of the disclosure is excellent in semiconductor characteristics.

BRIEF DESCRIPTION OF THE DRAWINGS

FIG. 15-*a* is a schematic explanatory view illustrating a part of a step of manufacturing a semiconductor device as an embodiment of the disclosure.

FIG. 15-*b* is a schematic explanatory view illustrating a part of a step of manufacturing a semiconductor device as an embodiment of the disclosure.

FIG. 16-*a* is a schematic explanatory view illustrating a part of a step of manufacturing a semiconductor device as an embodiment of the disclosure.

FIG. 16-*b* illustrates a sectional view of a multilayer structure obtained from a step of manufacturing a semiconductor device as an embodiment of the disclosure.

FIG. 17-*a* illustrates a sectional view of a multilayer structure obtained from a step of manufacturing a semiconductor device as an embodiment of the disclosure.

FIG. 17-*b* illustrates a sectional view of a multilayer structure obtained from a step of manufacturing a semiconductor device as an embodiment of the disclosure.

FIG. 17-*c* illustrates a sectional view of a semiconductor device obtained from a step of manufacturing a semiconductor device as an embodiment of the disclosure.

DETAILED DESCRIPTION

Figure 1:
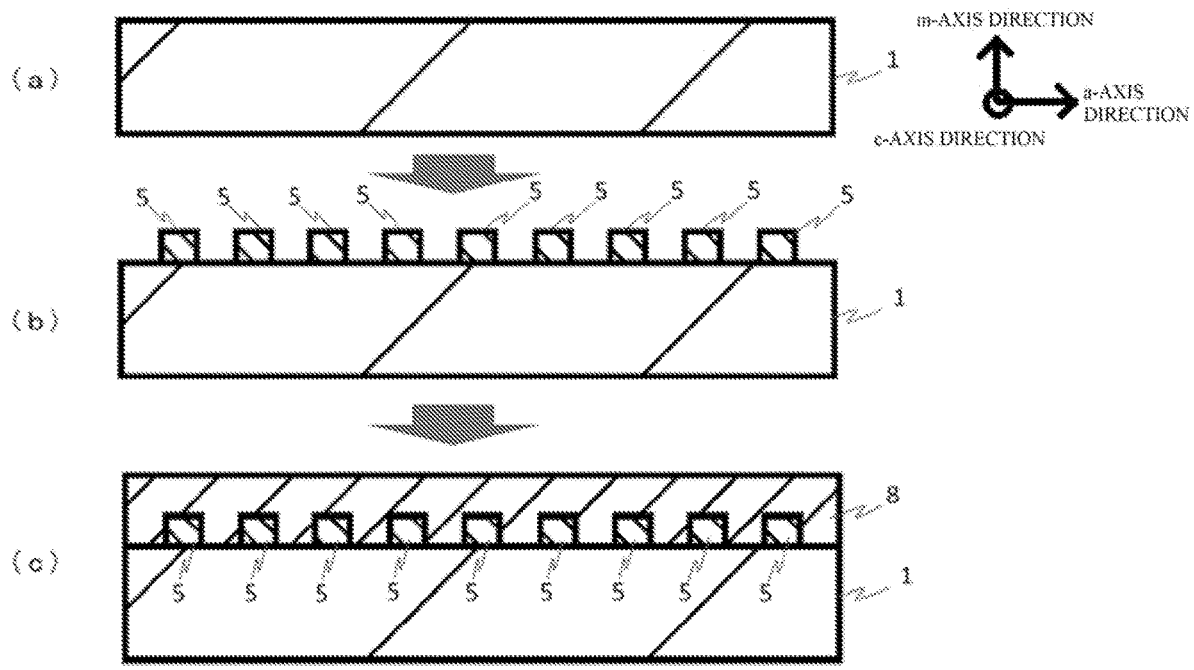
FIG. 1 is a schematic view explaining a part of a manufacturing step as one embodiment of a method of manufacturing a semiconductor device according to the disclosure.

The inventors of the present disclosure found out that implementing ELO (epitaxial lateral overgrowth) under a specific condition makes it possible to obtain a semiconductor device in which dislocation density in a Schottky junction region in a semiconductor film is lower than dislocation density an Ohmic junction region in the semiconductor film, and have found that such a semiconductor device has excellent semiconductor characteristics and has potential to solve the conventional problems.

Embodiments of the present disclosure will be described below with reference to the accompanying drawings. In the following description, the same parts and components are designated by the same reference numerals. The present embodiment includes, for example, the following disclosures.

[Structure 1]

A semiconductor device including: a semiconductor film including a Schottky junction region and an Ohmic junction region; a Schottky electrode arranged on the Schottky junction region; and an Ohmic electrode arranged on the Ohmic junction region, the Schottky junction region having a first dislocation density, the Ohmic junction region having a second dislocation region, and the first dislocation density being smaller than the second dislocation density.

[Structure 2]

The semiconductor device according to [Structure 1], wherein the semiconductor film includes a first semiconductor layer including the Schottky junction region and a second semiconductor layer including the Ohmic junction region.

[Structure 3]

The semiconductor device according to [Structure 2], wherein the second semiconductor layer is an $n^+$-type semiconductor layer.

[Structure 4]

The semiconductor device according to [Structure 2] or [Structure 3], wherein the first semiconductor layer is an $n^-$-type semiconductor layer.

[Structure 5]

The semiconductor device according to any one of [Structure 2] to [Structure 4], wherein a principal plane of the semiconductor layer is an m-plane.

[Structure 6]

The semiconductor device according to any one of [Structure 1] to [Structure 5], wherein the semiconductor film includes a lateral growth region

[Structure 7]

The semiconductor device according to any one of [Structure 1] to [Structure 6], wherein the semiconductor film has a thickness of equal to or greater than 1 μm.

[Structure 8]

The semiconductor device according to any one of [Structure 2] to [Structure 7], wherein the second semiconductor layer has a corundum structure.

[Structure 9]

The semiconductor device according to any one of [Structure 2] to [Structure 8], wherein the second semiconductor layer contains at least gallium.

[Structure 10]

The semiconductor device according to any one of [Structure 2] to [Structure 9], wherein the first semiconductor layer contains at least gallium.

[Structure 11]

The semiconductor device according to any one of [Structure 2] to [Structure 10], wherein the first semiconductor layer includes a p-type semiconductor region.

[Structure 12]

The semiconductor device according to any one of [Structure 1] to [Structure 11], wherein the semiconductor device is a power device.

[Structure 13]

The semiconductor device including a semiconductor film including a channel layer and an $n_+$-type semiconductor layer; and a gate electrode that is arranged directly or via another layer on the channel layer, the channel layer having a first dislocation density, the $n^+$-type semiconductor layer having a second dislocation density, and the first dislocation density is smaller than the second dislocation density.

[Structure 14]

The semiconductor device according to any one of [Structure 13], wherein the semiconductor layer has a corundum structure, and the channel layer is arranged along with a direction of m-axis or a direction of an a-axis.

[Structure 15]

A semiconductor system including a semiconductor device, the semiconductor device being the semiconductor device according to any one of [Structure 1] to [Structure 14].

[Structure 16]

A method of manufacturing a semiconductor device including: arranging a mask on a crystal substrate directly or via a crystal layer in such a manner that the mask extends lengthwise in a direction conforming to a c-axis direction of the crystal substrate; and causing crystal growth of a semiconductor film on the crystal substrate on which the mask is arranged.

[Structure 17]
A method of manufacturing a semiconductor device including arranging a mask on a crystal substrate directly or via a crystal layer; causing crystal growth of a semiconductor film on the crystal substrate on which the mask is arranged; using the mask as an electrode or a gate insulating layer.
[Structure 18]
The manufacturing method according to [Structure 16] or [Structure 17], wherein the mask contains an electrode material and using the mask as the electrode.
[Structure 19]
The manufacturing method according to [Structure 16] or [Structure 17], wherein the mask contains a dielectric material and using the mask as the gate insulating layer.
[Structure 20]
The manufacturing method according to any one of [Structure 16] to [Structure 19], including removing at least the crystal substrate.

As one embodiment of a semiconductor device of the disclosure, the semiconductor device includes: a semiconductor film including a Schottky junction region and an Ohmic junction region; a Schottky electrode arranged on the Schottky junction region in the semiconductor film; and an Ohmic electrode arranged on the Ohmic junction region, and is characterized in that dislocation density in the Schottky junction region in the semiconductor film is lower than dislocation density in the Ohmic junction region in the semiconductor film. According to an embodiment of the disclosure, dislocation is selectively reducible in a region in which a Schottky junction is formed, making it possible to obtain a semiconductor device having excellent semiconductor characteristics. Here, the Schottky junction region is a region in the semiconductor film at a distance of equal to or less than 100 nm from an interface between the semiconductor film and the Schottky electrode, for example. Also, the Ohmic junction region is a region in the semiconductor film at a distance of equal to or less than 100 nm from an interface between the semiconductor film and the Ohmic electrode, for example. According to an embodiment of the disclosure, the semiconductor film preferably includes a first semiconductor layer forming a Schottky junction with the Schottky electrode, and a second semiconductor layer forming an Ohmic junction with the Ohmic electrode. According to an embodiment of the disclosure, it is preferable that dislocation density in the first semiconductor layer is lower than dislocation density in the second semiconductor layer.

As one embodiment, the semiconductor device is a semiconductor device including at least an electrode and a semiconductor film, and is characterized in that the semiconductor film has a crystal structure with a c-axis and the electrode extends in a direction of the c-axis. The phrase "the electrode extends in a direction of the c-axis" herein means that a lengthwise direction of the electrode is parallel to the c-axis direction of the semiconductor film and includes a direction in an angular range of up to 5° from the c-axis direction. The shape of the electrode is not particularly limited. If the electrode is arranged in such a manner that its shape has lengths defined in two or more directions, the lengthwise direction means a direction of a greater length.

As one embodiment of a method of manufacturing a semiconductor device of the disclosure, the manufacturing method includes: arranging a mask on an m-plane of a crystalline base defining the m-plane as a principal plane in such a manner that the mask extends lengthwise in a direction conforming a c-axis direction of the crystalline base; and causing crystal growth of a semiconductor film on the m-plane of the crystalline base. According to an embodiment of the disclosure, an electrode material is available for forming the mask. A semiconductor layer grown through ELO from the crystalline base is formed while extending over the mask. Thus, if the mask is used as an electrode, favorable crystallinity is provided in the vicinity of an interface between the electrode and the semiconductor layer. Using the mask as an electrode further makes it possible to obtain a semiconductor device with a favorable joint state between the semiconductor layer grown through ELO and the electrode.

As one embodiment of a method of manufacturing a semiconductor device of the disclosure, the manufacturing method includes forming a semiconductor layer composed of a crystal film laterally grown on a crystal substrate having an ELO mask, and is characterized in that the ELO mask is used as an electrode or a gate insulating film. According to another embodiment, the mask is also formable using a material containing Si and having lower conductivity than an electrode. According to one embodiment, the mask may contain a dielectric material or may be a mask made of a dielectric material. The mask may be used as a dielectric film in the semiconductor device. The present inventors have acquired knowledge that implementing ELO under a specific condition makes it possible to easily obtain a semiconductor device with a favorable joint state at an interface between a dielectric film and a semiconductor layer, with favorable crystallinity in a channel layer, and with excellent semiconductor characteristics.

As another embodiment of a semiconductor device of the disclosure, the semiconductor device includes at least a dielectric film and a semiconductor film, and is characterized in that the semiconductor film has a crystal structure with a c-axis, and the dielectric film extends in a direction of the c-axis. The phrase "the dielectric film extends in a direction of the c-axis" herein means that a lengthwise direction of the dielectric film is parallel to the c-axis direction of the semiconductor film and includes a direction in an angular range of up to 5° from the c-axis direction.

Furthermore, as one embodiment of a method of manufacturing a semiconductor device of the disclosure, the manufacturing method includes forming a semiconductor layer including lateral growth region on a crystalline base on which a mask is arranged. As one embodiment, a mask containing an electrode material may be arranged on the crystalline base, used for ELO growth, and then the mask may be used as an electrode of a semiconductor device.

Figure 10:
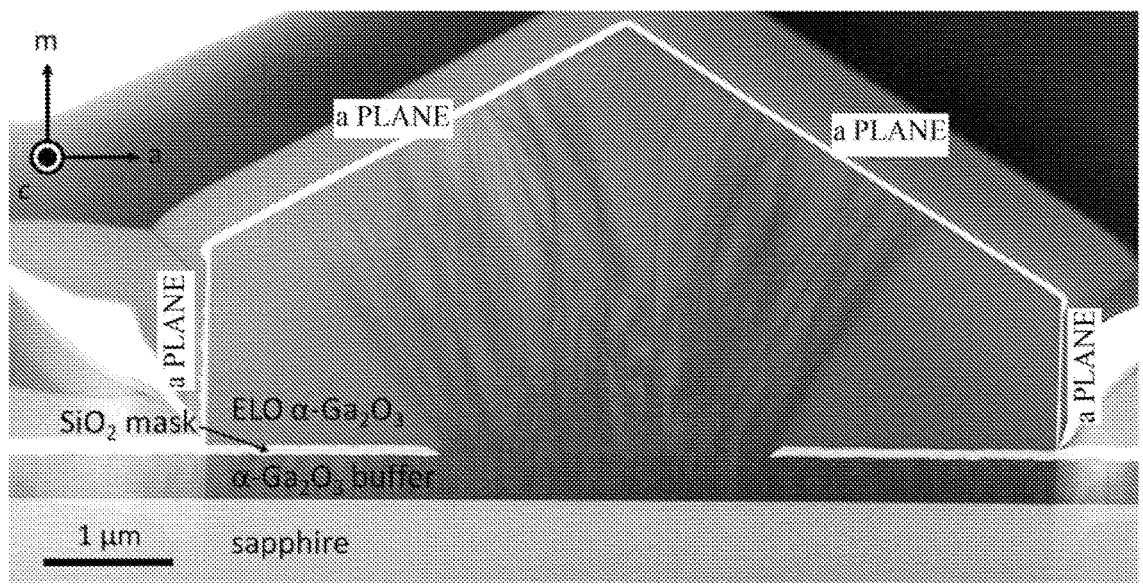
FIG. 10 illustrates a TEM image according to an example of the disclosure.
Figure 11:
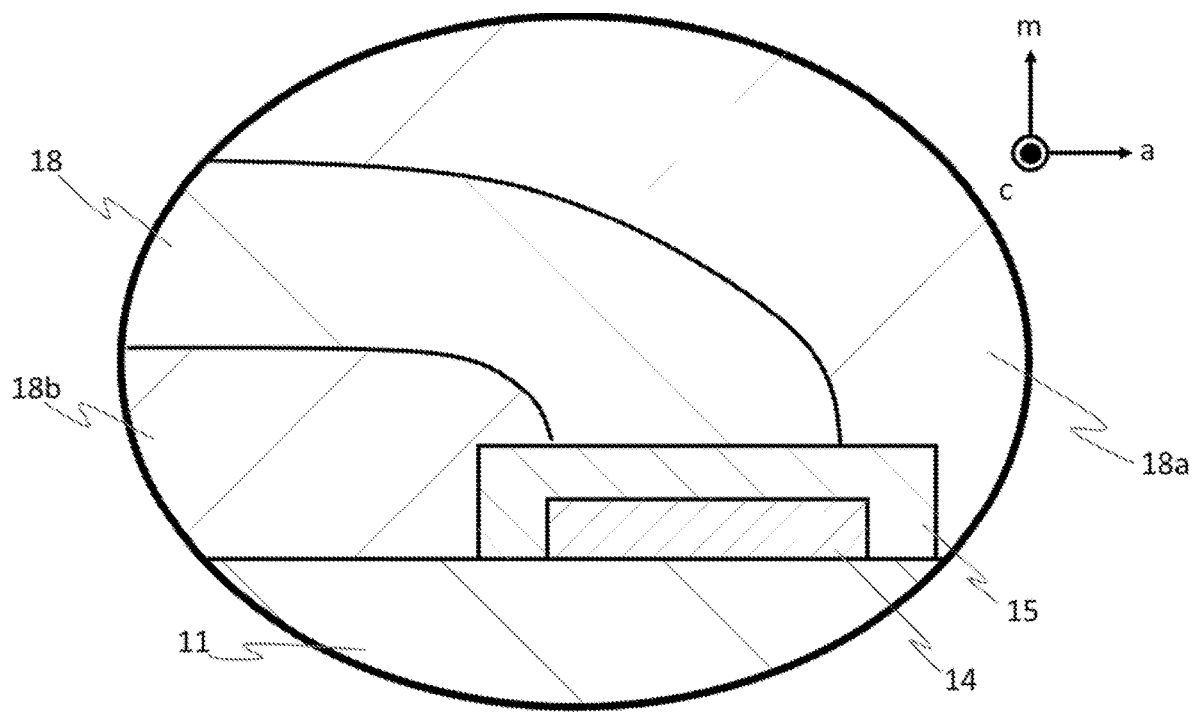
FIG. 11 illustrates a principal part of an example of a semiconductor device as an embodiment of the disclosure.
Figure 12:
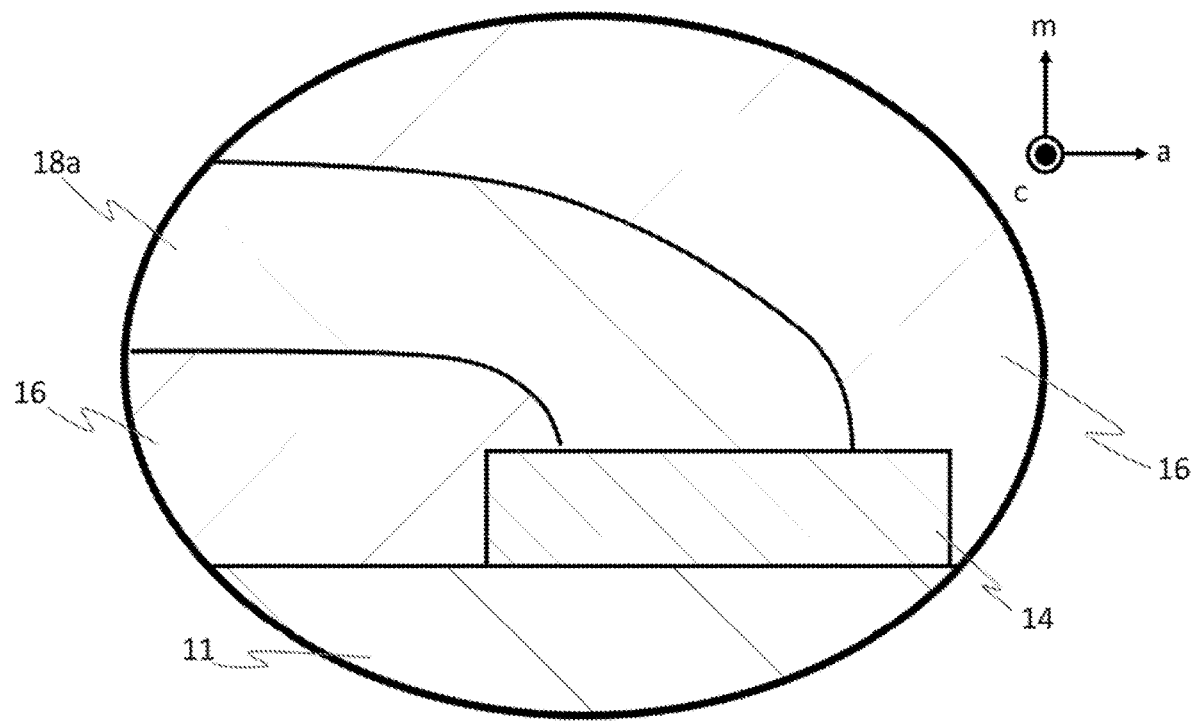
FIG. 12 illustrates a principal part of an example of a semiconductor device as an embodiment of the disclosure.

As another embodiment of the disclosure, a mask containing a dielectric material may be arranged, used for ELO growth, and then may be used as a gate insulating film of a semiconductor device. The phrase "the dielectric film extends in a direction of a c-axis" herein means that, as described above, a lengthwise direction of the dielectric film is parallel to the c-axis direction of the semiconductor film and includes a direction in an angular range of up to 5° from the c-axis direction. The lengthwise direction of the dielectric film may entirely be parallel to the c-axis direction. Alternatively, the dielectric film may partially extend in the c-axis direction. In the present embodiment, the term "c-axis direction" means a direction vertical to a c-plane. A crystal structure including the c-axis is a corundum structure, for example. According to the disclosure, forming such a structure makes it possible to obtain a semiconductor device with a favorable joint state at an interface between a dielectric film and a semiconductor layer, with favorable crystallinity in a channel layer, and with excellent semiconductor characteristics. As one embodiment of the disclosure, the semiconductor layer preferably includes a lateral growth region. Preferably, according to an embodiment of the disclosure, the semiconductor includes a first semiconductor region and a second semiconductor region, the first semiconductor region is joined to the dielectric film, and the second semiconductor region includes more dislocation than the first semiconductor region. It is also preferable that the semiconductor layer has a thickness of equal to or greater than 1 μm. It is still preferable that the semiconductor layer has a corundum structure. Also preferably, the semiconductor layer contains at least gallium. Still preferably, the dielectric film is a gate insulating film. As one embodiment of the disclosure, a semiconductor device includes at least a dielectric film a first semiconductor layer, and a second semiconductor layer. Preferably, the first semiconductor layer has a crystal structure including a c-axis and the dielectric film extends in a direction of the c-axis. Preferably, the first semiconductor layer includes a first semiconductor region and a second semiconductor region, the second semiconductor layer includes a first semiconductor region and a second semiconductor region, the first semiconductor region in the first semiconductor layer is joined to the dielectric film, and in the first semiconductor layer, dislocation occurs less in the first semiconductor region than in the second semiconductor region. A preferred example of the above-described semiconductor device is a semiconductor device illustrated in FIG. 11 or 12. Such a semiconductor device makes it possible to form a channel layer of higher quality and to fulfill more excellent semiconductor characteristics. More specifically, FIG. 11 is a view illustrating a principal part of an MOSFET. The MOSFET in FIG. 11 includes at least a substrate 11, a gate electrode 14, a gate insulating film 15, a channel layer 18, an n$^-$-type semiconductor layer 18a, and an n$^+$-type semiconductor layer 18b. According to the disclosure, by using the above-described dielectric film as a gate insulating film, a channel layer preferably becomes a dislocation-free layer to fulfill more excellent semiconductor characteristics. As apparent from FIG. 11, a first dislocation density of the channel layer 18 is smaller than a second dislocation density of the n$^+$-type semiconductor layer 18b. Also, applying an ELO method as discussed below with FIG. 10, the channel layer 18 is arranged along with a direction of m-axis or a direction of a-axis, preferably along with the direction of a-axis. FIG. 12 illustrates a principal part of an SBD. The SBD in FIG. 12 includes at least a substrate 11, an electrode (Schottky electrode) 14, a semi-insulator layer 16, and an n$^-$-type semiconductor layer 18a. According to the disclosure, the above-described Schottky electrode material is used as an ELO mask as a Schottky electrode. This not only provides a favorable Schottky junction but also preferably forms a dislocation-free layer in a drift layer in the vicinity of a Schottky interface, for example, making it possible to fulfill more excellent semiconductor characteristics. According to a preferable embodiment of the disclosure, also referring to FIG. 10, a principal plane of the SBD is m-plane. In other words, a current preferably flows in a direction of m-axis.

The dielectric film (dielectric material) is not particularly limited but may be a publicly-known dielectric film. While the relative permittivity of the dielectric films is also free from particular limitation, this relative permittivity is preferably equal to or less than 5. The term "relative permittivity" is a ratio between the permittivity of a film and the permittivity of vacuum. Examples of the dielectric film include an oxide film, a phosphorylated film, and a nitride film. According to the disclosure, the dielectric film is preferably a film containing Si. A preferred example of the film containing Si is a silicon oxide-based film. Examples of the silicon oxide-based film include an SiO$_2$ film, a phosphorous-added SiO$_2$ (PSG) film, a boron-added SiO$_2$ film, a phosphorated boron-added SiO$_2$ film (BPSG) film, an SiOC film, and an SiOF film. Means of forming the dielectric film is not particularly limited. Examples of such means include CVD method, atmospheric CVD method, plasma CVD method, mist CVD method, and thermal oxidation method. According to the disclosure, means of forming the dielectric film is preferably mist CVD method or atmospheric CVD method. While the thickness of the dielectric film is not particularly limited, the thickness of the dielectric film is preferably equal to or greater than 1 μm at least partially. According to the disclosure, stacking such a thick dielectric film on the semiconductor layer still makes it possible to obtain a result preferably without crystal defect due to stress concentration in the semiconductor layer.

The gate insulating film is not particularly limited but may be a publicly-known gate insulating film unless it interferes with the purpose of the present disclosure. Preferred examples of the gate insulating film include oxide films such as films of SiO$_2$, Si$_3$N$_4$, Al$_2$O$_3$, GaO, AlGaO, InAlGaO, AlInZnGaO$_4$, AlN, Hf$_2$O$_3$, SiN, SiON, MgO, GdO, and an oxide film containing at least phosphorus. Means of forming the gate insulating film may be publicly-known means. Examples of such publicly-known forming means include dry method and wet method. Examples of the dry method include publicly-known means such as sputtering, vacuum evaporation, CVD, and PLD. Examples of the wet method include coating means such as screen printing and die coating.

The semiconductor layer (hereinafter also called "oxide semiconductor film," "semiconductor film," or "crystal film" simply) is preferably an oxide having a corundum structure. According to the disclosure, the oxide preferably contains one or two or more types of metals selected from Group 9 (for example, cobalt, rhodium, or iridium) and Group 13 (for example, aluminum, gallium, or indium) of the periodic table. More preferably, the oxide contains at least one type of metal selected from aluminum, indium, gallium, and iridium, still more preferably, contains at least gallium or iridium, most preferably, contains at least gallium. According to the disclosure, it is more preferable that a principal plane of the oxide semiconductor film is an m-plane as it restricts diffusion of oxygen, etc. further and fulfills more excellent electric characteristics. The oxide semiconductor layer may have an off-angle. According to the disclosure, the oxide is preferably α-Ga$_2$O$_3$ or a mixed crystal of α-Ga$_2$O$_3$. The term "major component" means that the oxide has a content in terms of an atomic ratio of equal to or greater than 50% preferably to all components in the semiconductor layer, means that the content is more preferably equal to or greater than 70%, still more preferably, equal to or greater than 90%, and means the content may be 100%. The thickness of the semiconductor layer is not particularly limited but may be equal to or less than 1 μm or equal to or greater than 1 μm. According to the disclosure, this thickness is preferably equal to or greater than 1 μm, more preferably, equal to or greater than 10 μm. While the surface area of the semiconductor film is not particularly limited, it may be equal to or greater than 1 mm$^2$ or equal to or less than 1 mm$^2$. This surface area is preferably from 10 mm$^2$ to 300 cm$^2$, more preferably, from 100 mm$^2$ to 100 cm$^2$. While the semiconductor film is preferably a single-crystal film, it may be a poly-crystal film or a crystal film containing poly crystal. According to one embodiment of a manufacturing method of the disclosure, a semiconductor film including at least a first semiconductor layer and a second semiconductor layer may be formed by forming an $n^+$-type semiconductor layer on a crystalline base and forming an $n^-$-type semiconductor layer lower in dopant concentration than the $n^+$-type semiconductor layer, for example, on the $n^+$-type semiconductor layer. Furthermore, an embodiment of the disclosure allows focusing of a growth direction of dislocation. By doing so, further improvement of crystallinity is achieved in a region largely relating, particularly to the characteristics of a semiconductor device (specifically, Schottky characteristics).

The semiconductor layer preferably contains a dopant. The dopant is not particularly limited but may be publicly-known. Examples of the dopant include n-type dopants such as tin, germanium, silicon, titanium, zirconium, vanadium, and niobium, and p-type dopants such as magnesium, calcium, and zinc. According to the disclosure, the semiconductor layer preferably contains an n-type dopant, more preferably, is an n-type oxide semiconductor layer. Furthermore, according to the disclosure, the n-type dopant is preferably Sn, Ge, or Si. The content of the dopant is preferably equal to or greater than 0.00001 atomic % in the composition of the semiconductor layer, more preferably, from 0.00001 to 20 atomic %, most preferably, from 0.00001 to 10 atomic %. More specifically, the concentration of the dopant may generally be from about $1 \times 10^{16}$ to about $1 \times 10^{22}/cm^3$. The concentration of the dopant may be set to a low concentration of equal to or less than about $1 \times 10^{17}/cm^3$, for example. According to an embodiment of the disclosure, the dopant may be contained at a high concentration of equal to or greater than $1 \times 10^{20}/cm^3$. The concentration of fixed charge in the semiconductor layer is also free from particular limitation. As one embodiment of a semiconductor device of the disclosure, this concentration is preferably equal to or less than $1 \times 10^{17}/cm^3$ as it allows a depletion layer to be formed favorably using the semiconductor layer.

The semiconductor layer may be formed using publicly-known means. Examples of the means of forming the semiconductor layer include CVD method, MOCVD method, MOVPE method, mist CVD method, mist epitaxy method, MBE method, HVPE method, pulse growth method, and ALD method.

The following explains an example of a method of manufacturing the semiconductor device by forming the semiconductor layer (hereinafter also called "crystal growth layer" or "crystal film") using HVPE method.

Figure 2:
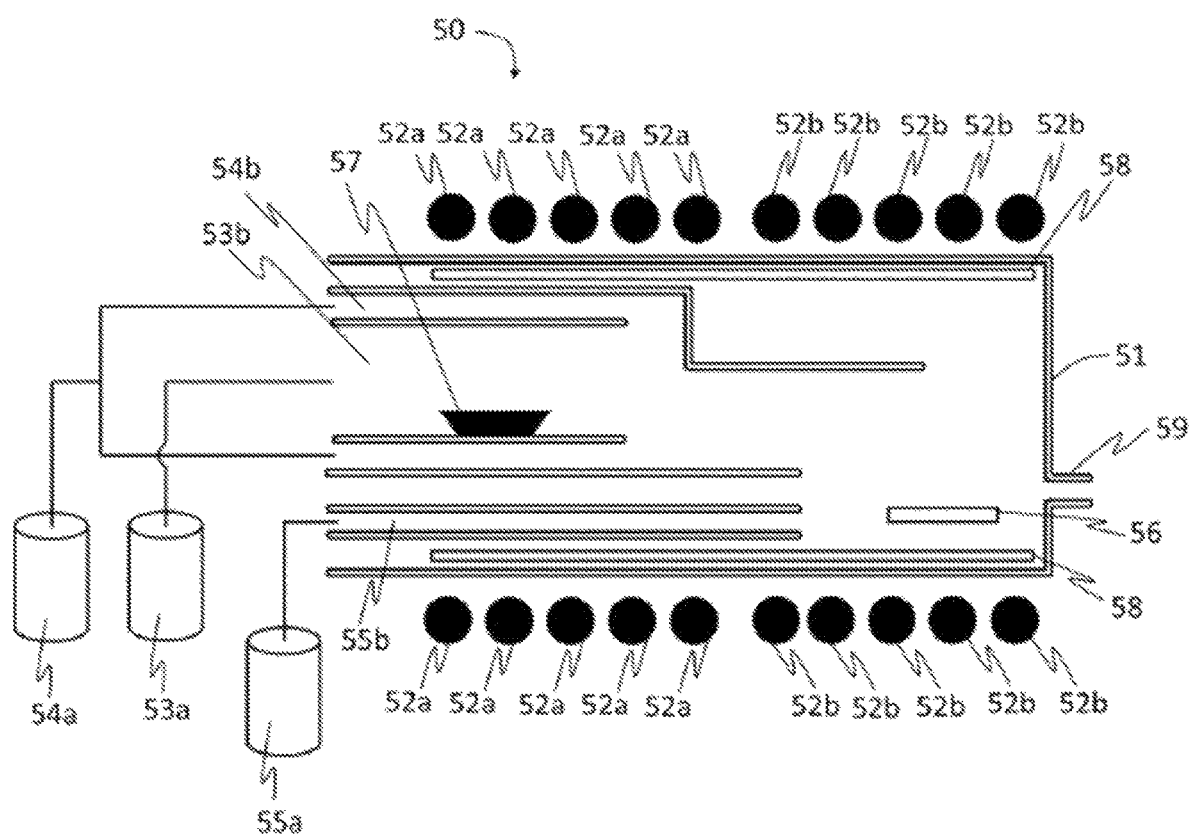
FIG. 2 is a view explaining a halide vapor phase epitaxy (HVPE) apparatus preferably used in an embodiment of the disclosure.

As one embodiment of the HVPE method, by using an HVPE apparatus illustrated in FIG. 2, for example, a metallic source containing metal is gasified to form a metal-containing raw material gas. Next, the metal-containing raw material gas and an oxygen-containing raw material gas are supplied onto a crystalline base in a reaction chamber to deposit a film. During this film deposition, by using a crystalline base having a surface provided with an ELO mask composed of the above-described dielectric film, for example, a reactive gas is supplied onto the crystalline base and the film deposition proceeds while the reactive gas flows. According to one embodiment of the disclosure, the crystalline base is preferably a crystalline substrate. According to another embodiment of the disclosure, the crystalline base may include a crystalline substrate and a crystal layer arranged on the crystalline substrate.

(Metallic Source)

The metallic source is not particularly limited as long as it contains metal and is available for gasification. The metal may be metal as a single element or a metal compound. Examples of the metal include one or two or more types of metals selected from gallium, aluminum, indium, iron, chromium, vanadium, titanium, rhodium, nickel, cobalt, and iridium. According to the disclosure, the metal is preferably one or two or more types of metals selected from gallium, aluminum, and indium. More preferably, the metal is gallium. Most preferably, the metallic source is gallium as a single element. The metallic source may be in a gas form, in a liquid form, or in a solid form. According to the disclosure, if gallium is used as the metal, for example, the metallic source is preferably in a liquid form.

Means of the gasification is not particularly limited but may be publicly-known means unless it interferes with the purpose of the present disclosure. According to the disclosure, means of the gasification is preferably conducted through halogenation of the metallic source. A halogenating agent used for the halogenation is not particularly limited but may be a publicly-known halogenating agent as long as it is available for halogenation of the metallic source. Examples of the halogenating agent include halogen and hydrogen halide. Examples of the halogen include fluorine, chlorine, bromine, and iodine. Examples of the hydrogen halide include hydrogen fluoride, hydrogen chloride, hydrogen bromide, and hydrogen iodide. According to the disclosure, hydrogen halide is preferably used, more preferably, hydrogen chloride is used for the halogenation. According to the disclosure, the gasification is preferably conducted by supplying halogen or hydrogen halide as a halogenating agent to the metallic source and causing reaction between the metallic source and halogen or hydrogen halide at a temperature of equal to or higher than a gasification temperature of metal halide to form metal halide. According to the disclosure, while a reaction temperature for the halogenation is not particularly limited, it is preferably equal to or less than 900° C., more preferably, equal to or less than 700° C., most preferably, from 400 to 700° C. if the metal in the metallic source is gallium and if the halogenating agent is HCl. The above-described metal-containing raw material gas is not particularly limited as long as it is gas containing the metal in the metallic source. Examples of the metal-containing raw material gas include halide in the metal (fluoride, chloride, bromide, iodide, etc.).

According to an embodiment of the disclosure, after the metallic source containing the metal is gasified to form the metal-containing raw material gas, the metal-containing raw material gas and the oxygen-containing raw material gas are supplied onto a crystalline base in the reaction chamber. According to an embodiment of the disclosure, a reactive gas is supplied onto the substrate. Examples of the oxygen-containing raw material gas include $O_2$ gas, $CO_2$ gas, NO gas, $NO_2$ gas, $N_2O$ gas, $H_2O$ gas, and $O_3$ gas. According to the disclosure, the oxygen-containing raw material gas is preferably one or two or more types of gases selected from a group consisting of $O_2$, $H_2O$, and $N_2O$, more preferably, it contains $O_2$. As one embodiment, the oxygen-containing raw material gas may contain $CO_2$. The reactive gas is a reactive gas generally differing from the metal-containing raw material gas and the oxygen-containing raw material gas and does not include an inert gas. While the reactive gas is not particularly limited, it may be an etching gas, for example. The etching gas is not particularly limited but may be a publicly-known etching gas unless it interferes with the purpose of the present disclosure. According to the disclosure, the reactive gas is preferably halogen gas (for example, fluorine gas, chlorine gas, bromine gas, or iodine gas), hydrogen halide gas (for example, hydrofluoric acid gas, hydrochloric acid gas, hydrogen bromide gas, or hydrogen iodide gas), hydrogen gas, or a mixed gas of two or more types of these gases. Preferably, the reactive gas includes the hydrogen halide gas, most preferably, includes hydrogen chloride. The metal-containing raw material gas, the oxygen-containing raw material gas, and the reactive gas may include a carrier gas. Examples of the carrier gas include inert gases such as nitrogen or argon. According to the disclosure, while the partial pressure of the metal-containing raw material gas is not particularly limited, it is preferably from 0.5 Pa to 1 kPa, more preferably, from 5 Pa to 0.5 kPa. According to the disclosure, while the partial pressure of the oxygen-containing raw material gas is not particularly limited, it is preferably from 0.5 to 100 times the partial pressure of the metal-containing raw material gas, more preferably, from one to 20 times the partial pressure of the metal-containing raw material gas. According to an embodiment of the disclosure, while the partial pressure of the reactive gas is also free from particular limitation, it is preferably from 0.1 to 5 times the partial pressure of the metal-containing raw material gas, more preferably, from 0.2 to 3 times the partial pressure of the metal-containing raw material gas.

According to an embodiment of the disclosure, it is preferable to supply a dopant-containing raw material gas further to the substrate. The dopant-containing raw material gas is not particularly limited as long as it contains a dopant. According to the disclosure, while the dopant is also free from particular limitation, the dopant preferably includes one or two or more types of elements selected from germanium, silicon, titanium, zirconium, vanadium, niobium, and tin. More preferably, the dopant includes germanium, silicon, or tin, most preferably, includes germanium. Using such a dopant-containing raw material gas makes it possible to easily control the conductivity of a resultant film. The dopant-containing raw material gas preferably contains the dopant in the form of a compound (such as halide or oxide, for example), more preferably, in the form of halide. According to the disclosure, while the partial pressure of the dopant-containing raw material gas is not particularly limited, it is preferably from $1 \times 10^{-7}$ to 0.1 times the partial pressure of the metal-containing raw material gas, more preferably, from $2.5 \times 10^{-7}$ to $7.5 \times 10^{-2}$ times the partial pressure of the metal-containing raw material gas. According to the disclosure, it is preferable to supply the dopant-containing raw material gas onto the crystalline base together with the reactive gas.

(Crystal Substrate)

As one embodiment of the disclosure, the crystalline base is preferably a crystal substrate. The crystal substrate is not particularly limited but may be a publicly-known substrate as long as it contains a crystal substance as a major component. The crystal substrate may be an insulator substrate, a conductive substrate, or a semiconductor substrate. The crystal substrate may be a single-crystal substrate or a poly-crystal substrate. For example, the crystal substrate may be a substrate containing a crystal substance having a corundum structure as a major component. The term "major component" means that the substrate contains the crystal substance in terms of a composition ratio in the substrate of equal to or greater than 50%, preferably equal to or greater than 70%, more preferably, equal to or greater than 90%.

Examples of the substrate containing the crystal substance having the corundum structure as a major component include a sapphire substrate and an a-type gallium oxide substrate.

According to an embodiment of the disclosure, the crystal substrate is preferably a sapphire substrate. Examples of the sapphire substrate include an m-plane sapphire substrate and an a-plane sapphire substrate. According to the disclosure, the sapphire substrate is preferably an m-plane sapphire substrate. The sapphire substrate may have an off-angle. While the off-angle is not particularly limited, it is preferably from 0 to 15°. While the thickness of the crystal substrate is not particularly limited, it is preferably from 50 to 2000 μm, more preferably, from 200 to 800 μm. While the area of the crystal substrate is not particularly limited, it is preferably equal to or greater than 15 cm$^2$, more preferably, equal to or greater than 100 cm$^2$.

According to one embodiment of a semiconductor device of the disclosure, the crystalline base preferably includes a mask (also called an ELO mask) composed of the above-described electrode, for example. While a constituent material of the ELO mask is not particularly limited, it is preferably an electrode material. Preferably, the constituent material has conductive property and is used as each of an Ohmic electrode and a Schottky electrode. The electrode material may be publicly-known metal. Preferably, the metal is at least one type of metal selected from Group 4 to Group 11 of the periodic table, for example. Examples of metal in Group 4 of the periodic table include titanium (Ti), zirconium (Zr), and hafnium (Hf). Examples of metal in Group 5 of the periodic table include vanadium (V), niobium (Nb), and tantalum (Ta). Examples of metal in Group 6 of the periodic table include chromium (Cr), molybdenum (Mo), and tungsten (W). Examples of metal in Group 7 of the periodic table include manganese (Mn), technetium (Tc), and rhenium (Re). Examples of metal in Group 8 of the periodic table include iron (Fe), ruthenium (Ru), and osmium (Os). Examples of metal in Group 9 of the periodic table include cobalt (Co), rhodium (Rh), and iridium (Ir). Examples of metal in Group 10 of the periodic table include nickel (Ni), palladium (Pd), and platinum (Pt). Examples of metal in Group 11 of the periodic table include copper (Cu), silver (Ag), and gold (Au). While the thickness of each of the layers of the above-listed metals is not particularly limited, it is preferably from 0.1 nm to 10 μm, more preferably, from 5 to 500 nm, most preferably, from 10 to 200 nm. Means of forming the electrode is not particularly limited but may be publicly-known means. Specific examples of the forming means include dry method and wet method. Examples of the dry method include sputtering, vacuum evaporation, and CVD. Examples of the wet method include screen printing and die coating.

According to a one embodiment of the disclosure, the crystalline base preferably includes an ELO mask composed of the dielectric film (for example, a gate insulating film), for example. In this case, the ELO mask generally includes a gate electrode. An electrode material of the gate electrode is an electrode material mentioned below. Covering the gate electrode with the ELO mask makes it possible to easily obtain a semiconductor device, particularly, an MOSFET having a channel layer of higher crystal quality. A constituent material of the ELO mask is not particularly limited but may be a publicly-known mask material. The constituent material may be an insulator material, a conductive material, or a semiconductor material. The constituent material may be amorphous, single crystal, or poly crystal. Examples of a constituent material of the ELO mask include oxide, nitride, and carbide of Si, Ge, Ti, Zr, Hf, Ta, and Sn, carbon, diamond, metal, and mixtures of these materials. More specifically, this constituent material may be an Si-containing compound containing $SiO_2$, SiN, or poly-crystal silicon as a major component, or metal having a higher melting point than a crystal growth temperature of the crystalline oxide semiconductor (examples of this metal include precious metals such as platinum, gold, silver, palladium, rhodium, iridium, and ruthenium). The content of the constituent material in the ELO mask is preferably equal to or greater than 50%, more preferably, equal to or greater than 70%, most preferably, equal to or greater than 90% in terms of a composition ratio.

Means of forming the ELO mask may be publicly-known means. For example, this forming means is publicly-known patterning means and examples of this means include photolithography, electron beam lithography, laser patterning, and subsequent etching (dry etching or wet etching, for example). According to an embodiment of the disclosure, while a pitch interval of the resultant pattern shape is not particularly limited, it is preferably equal to or less than 100 µm, more preferably, from 0.5 to 50 µm, most preferably, from 0.5 to 10 µm.

An example of an embodiment of a substrate for crystal growth (crystal substrate) used preferably in the disclosure will be described below by referring to the drawings.

Figure 3:
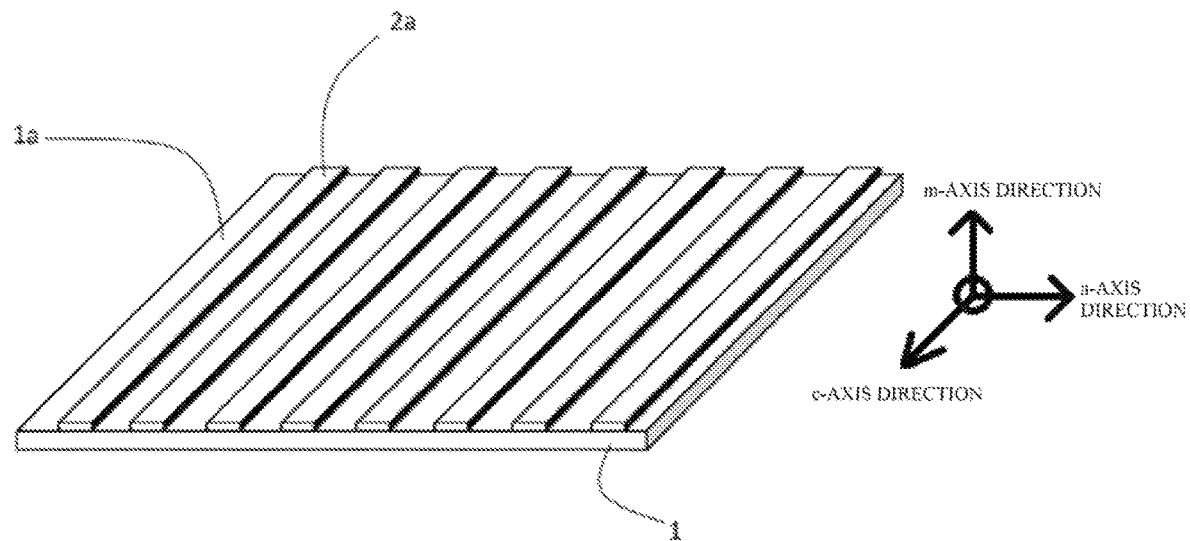
FIG. 3 is a schematic view illustrating an embodiment of a part with recesses and projections formed on a surface of a crystalline base preferably used in an embodiment of the disclosure.

FIG. 3 illustrates one embodiment of a projection composed of the above-described ELO mask provided on a crystal growth surface of a crystal substrate used preferably in the disclosure. The crystal substrate including the ELO mask in FIG. 3 is composed of a crystal substrate 1, and a projection 2a projecting on a crystal growth surface 1a. The projection 2a has a stripe shape relative to the crystal growth surface 1a and extends in a c-axis direction. The projections 2a in a strip pattern are aligned periodically on the crystal growth surface 1a of the crystal substrate 1. The projection 2a is made of a silicon-containing compound such as SiO2, for example, and may be formed by publicly-known means such as photolithography. According to another embodiment, a metal layer may be arranged as an ELO mask.

According to the disclosure, while the width and height of the projection, and an interval between the projections are not particularly limited, each of the width, height, and interval is within a range from about 10 nm to about 1 mm, for example, preferably, from about 10 nm to about 300 µm, more preferably, from about 10 nm to about 10 µm.

According to an embodiment of the disclosure, as illustrated in FIG. 15-a, for example, a crystalline base 110 may include a crystal substrate 1 and a crystal layer 3 (a buffer layer including a stress relaxing layer, for example) arranged on the crystal substrate 1. According to an embodiment of the disclosure, in the crystal substrate 1, the buffer layer 3 is arranged on at least a part of a surface of the crystal substrate. The ELO mask 2 is arranged on at least a part of the buffer layer 3. As another embodiment, an ELO mask may be arranged on at least a part of the crystal substrate and the crystalline base may include a buffer layer epitaxially grown from the crystal substrate. Means of forming the buffer layer is not particularly limited but may be publicly-known means. Examples of the forming means include spraying method, mist CVD method, HVPE method, MBE method, MOCVD method, and sputtering method. The following describes a preferred embodiment of formation of the buffer layer using mist CVD method in more detail.

Figure 4:
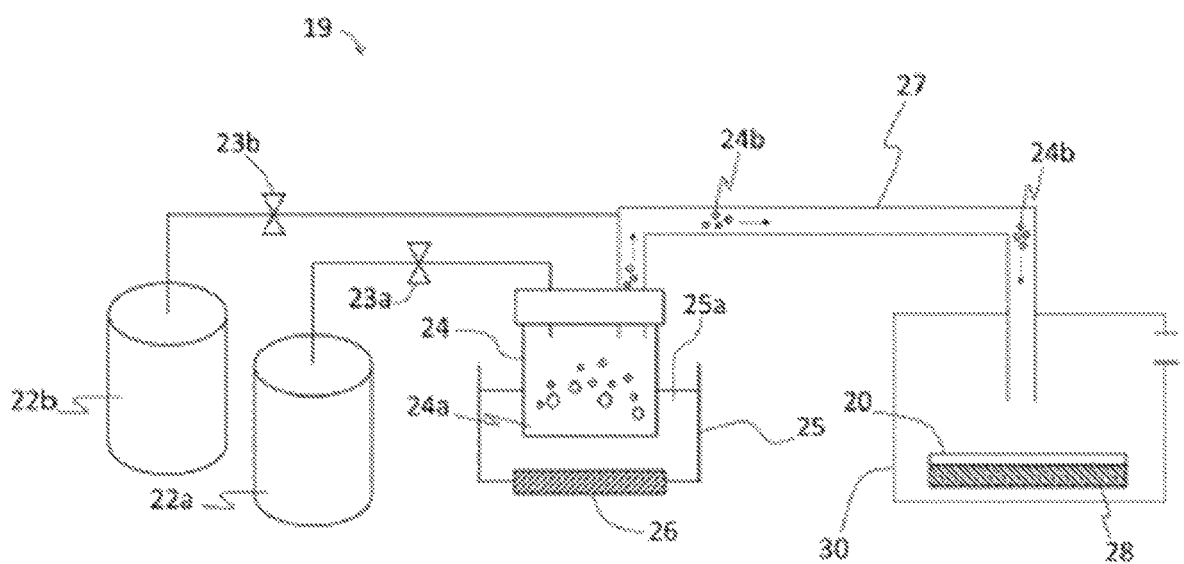
FIG. 4 is a view explaining a mist CVD apparatus preferably used in an embodiment of the disclosure.

Preferably, by using a mist CVD apparatus illustrated in FIG. 4, for example, the buffer layer may be formed by atomizing a raw material solution or generating droplets of the raw material solution (atomization step), carrying resultant atomized droplets onto the substrate using a carrier gas (carrying step), and then causing a thermal reaction of the atomized droplets on a part of a surface of the substrate or on the entire surface (buffer layer forming step). According to the disclosure, the crystal growth layer may be formed in the same way.

(Atomization Step)

At the atomization step, the raw material solution is atomized to obtain the atomized droplets. Means of atomizing the raw material solution is not particularly limited but may be publicly-known means as long as it is available for atomization of the raw material solution. According to the embodiment of the disclosure, atomization means using ultrasonic waves is preferred. The atomized droplets obtained by using ultrasonic waves are preferred as they have a zero initial velocity and are to flow in the air. The atomized droplets are free from damage due to collision energy so considerably preferred as they are mist to float in the air and carryable as a gas, not to be blown like a spray. The droplet size of the atomized droplets is not particularly limited and the atomized droplets may be droplets of several millimeters. Preferably, the droplet size is equal to or less than 50 µm, more preferably, from 0.1 to 10 µm.

(Raw Material Solution)

The raw material solution is not particularly limited as long as it is a solution available for atomization and available for forming the buffer layer by mist CVD. Examples of the raw material solution include aqueous solutions of organic metal complexes of metal for atomization (an acetylacetonate complex, for example) and halide (for example, fluoride, chloride, bromide, or iodide). The metal for atomization is not particularly limited. Examples of the metal for atomization include one or two or more types of metals selected from aluminum, gallium, indium, iron, chromium, vanadium, titanium, rhodium, nickel, cobalt, and iridium. According to the disclosure, the metal for atomization preferably includes at least gallium, indium, or aluminum, more preferably, includes at least gallium. While the content of the metal for atomization in the raw material solution is not particularly limited unless it interferes with the purpose of the present disclosure, it is preferably from 0.001 to 50 mol %, more preferably, from 0.01 to 50 mol %.

The raw material solution preferably contains a dopant. Including the dopant in the raw material solution makes it possible to easily control the conductive property of the buffer layer without performing ion implantation, etc., and without causing break of a crystal structure. According to the disclosure, the dopant is preferably tin, germanium, or silicon, more preferably, tin or germanium, most preferably, tin. The concentration of the dopant may generally be from about $1\times10^{16}$ to about $1\times10^{22}/cm^3$. The concentration of the dopant may be set to a low concentration of equal to or less than about $1\times10^{17}/cm^3$, for example. The dopant may be contained at a high concentration of equal to or greater than $1\times10^{20}/cm^3$.

A solvent of the raw material solution is not particularly limited but may be an inorganic solvent such as water, an organic solvent such as alcohol, or a mixed solvent of the inorganic solvent and the organic solvent. According to the disclosure, the solvent preferably includes water, more preferably, is water or a mixed solvent of water and alcohol, most preferably, is water. Specific examples of the water include pure water, ultrapure water, tap water, well water, mineral water, calcareous water, hot spring water, spring water, fresh water, and seawater. According to the embodiment, ultrapure water is preferred.

(Carrying Step)

At the carrying step, the atomized droplets are carried into a deposition chamber by using a carrier gas. The carrier gas is not particularly limited unless it interferes with the purpose of the disclosure. Preferred examples of the carrier gas include oxygen, ozone, an inert gas such as nitrogen or argon, and a reducing gas such as hydrogen gas or forming gas. Furthermore, the carrier gas may have one type, or two or more types. Moreover, a diluted gas (e.g., 10-fold diluted gas) and the like reduced in flow rate may be further used as a second carrier gas. A location for supplying the carrier gas is not limited to one but the carrier gas may be supplied from two or more locations. While the flow rate of the carrier gas is not particularly limited, it is preferably from 0.01 to 20 L/min., more preferably, from 1 to 10 L/min. In the case of a diluted gas, the flow rate of the diluted gas is preferably from 0.001 to 2 L/min., more preferably, from 0.1 to 1 L/min.

(Buffer Layer Forming Step)

At the buffer layer forming step, the atomized droplets are thermally reacted in a deposition chamber to form the buffer layer on a crystal substrate. The thermal reaction is simply required to be a reaction of the atomized droplets using heat. Conditions, etc. for the reaction are not particularly limited unless they interfere with the purpose of the present disclosure. At this step, the thermal reaction is generally made at a temperature equal to or higher than an evaporation temperature of a solvent. Preferably, this temperature does not exceed an excessively high temperature (1000° C., for example) more preferably, is equal to or less than 650° C., most preferably, is from 400 to 650° C. The thermal reaction may be made in any of atmospheres including vacuum atmosphere, non-oxygen atmosphere, reducing gas atmosphere, and oxygen atmosphere, or may be made under any of conditions including atmospheric pressure, increased pressure, and reduced pressure unless they interfere with the purpose of the present disclosure. According to the disclosure, the thermal reaction is preferably made under atmospheric pressure. The thickness of the buffer layer is settable through adjustment of a time of the formation.

After the buffer layer is formed as described above, a mask layer is arranged on the buffer layer to form the above-described crystal growth layer by the method described above. By doing so, it becomes possible to reduce defect such as tilt in the crystal growth layer to achieve more excellent film quality.

According to the disclosure, while the buffer layer is not particularly limited, it preferably contains a metal oxide as a major component. Examples of the metal oxide include metal oxides containing one or two or more types of metals selected from aluminum, gallium, indium, iron, chromium, vanadium, titanium, rhodium, nickel, cobalt, and iridium. According to the disclosure, the metal oxide preferably includes one or two or more types of elements selected from indium, aluminum, and gallium, more preferably, includes at least indium or/and gallium, most preferably, includes at least gallium. As one embodiment of a deposition method of the disclosure, the buffer layer may contain a metal oxide as a major component, and the metal oxide contained in the buffer layer may include gallium and aluminum of a smaller amount than gallium. Using the buffer layer containing aluminum of a smaller amount than gallium enables to achieve not only favorable crystal growth but also favorable high-temperature growth. As one embodiment of a deposition method of the disclosure, the buffer layer may have a superlattice structure. Using the buffer layer having the superlattice structure not only achieves favorable crystal growth but also further facilitates prevention of warpage occurring during crystal growth. The term "major component" herein means that the metal oxide has a content in terms of an atomic ratio of equal to or greater than 50% preferably to all components in the buffer layer, means that the content is more preferably equal to or greater than 70%, still more preferably, equal to or greater than 90%, and means that the content may be 100%. According to the disclosure, while a crystal structure of the crystalline oxide semiconductor is not particularly limited, it is preferably a corundum structure. Although the above-described crystal growth layer and buffer layer may have the same major component or have different major components unless it interferes with the purpose of the present disclosure, these layers preferably have the same major component in the disclosure.

According to the embodiment of the disclosure, a metal-containing raw material gas, an oxygen-containing raw material gas, a reactive gas, and if desired, a dopant-containing raw material gas are supplied onto the substrate on which the buffer layer may be provided and a film is deposited while the reactive gas flows. According to the disclosure, the film is preferably deposited on the heated substrate. While a temperature of the film deposition is not particularly limited unless it interferes with the purpose of the present disclosure, it is preferably equal to or less than 900° C., more preferably, equal to or less than 700° C., most preferably, from 400 to 700° C. The film deposition may be conducted in any of atmospheres including vacuum atmosphere, non-vacuum atmosphere, reducing gas atmosphere, inert gas atmosphere, and oxidizing gas atmosphere, or may be conducted under any of conditions including normal pressure, atmospheric pressure, increased pressure, and reduced pressure unless they interfere with the purpose of the present disclosure. According to the embodiment of the disclosure, the film deposition is preferably conducted under normal pressure or under atmospheric pressure. Furthermore, a film thickness is settable through adjustment of a deposition time.

The crystal growth layer generally contains a crystalline metal oxide as a major component. Examples of the crystalline metal oxide include metal oxides containing one or two or more types of metals selected from aluminum, gallium, indium, iron, chromium, vanadium, titanium, rhodium, nickel, cobalt, and iridium. According to the disclosure, the crystalline metal oxide preferably includes one or two or more types of elements selected from indium, aluminum, and gallium, more preferably, includes at least indium or/and gallium, most preferably, is crystalline gallium oxide or a mixed crystal of crystalline gallium oxide. Regarding the crystal growth layer according to an embodiment of the disclosure, the "major component" means that the crystalline metal oxide has a content in terms of an atomic ratio of equal to or greater than 50% preferably to all components in the crystal growth layer, means that the content is more preferably equal to or greater than 70%, still more preferably, equal to or greater than 90%, and means that the content may be 100%. According to an embodiment of the disclosure, conducting the film deposition described above using a substrate having a corundum structure as the above-described substrate makes it possible to obtain a crystal growth film having a corundum structure. According to an embodiment of the disclosure, while the crystalline metal oxide may be single crystal or poly crystal, it is preferably single crystal. While an upper limit of the thickness of the crystal growth layer is not particularly limited, it is 100 μm, for example. While a lower limit of the thickness of the crystal growth layer is also free from particular limitation, it is 1 μm, more preferably, 10 μm, most preferably, 20 μm. According to the disclosure, the thickness of the crystal growth layer is preferably from 3 to 100 µm, more preferably, from 10 to 100 µm, most preferably, from 20 to 100 µm.

A preferred manufacturing method according to an embodiment of a semiconductor device of the disclosure will be described below in more detail.

As illustrated in FIGS. 1(*a*) to (*c*), as one embodiment of a method of manufacturing a semiconductor device of the disclosure, it is preferable to use a sapphire substrate as a crystalline base. According to an embodiment of the disclosure, the sapphire substrate to be used is preferably a sapphire substrate having a principal plane that is either an m-plane or an a-plane. As one embodiment of the disclosure, with an m-plane of the crystalline base defined as a crystal growth surface, it is preferable to form an ELO mask on the m-plane in such a manner that the mask extends lengthwise in a direction conforming to a c-axis direction. FIG. 1(*a*) illustrates a sapphire substrate 1. As illustrated in FIG. 1(*b*), an ELO mask 5 is formed on a crystal growth surface of the sapphire substrate 1. The ELO mask 5 is arranged in such a manner as to extend lengthwise in a direction conforming a c-axis direction and has a stripe shape relative to the crystal growth surface. A crystal growth layer is formed using the substrate for crystal growth in FIG. 1(*b*) to obtain a multilayer structure in FIG. 1(*c*). In the multilayer structure (c), a crystal growth layer 8 is formed on the sapphire substrate 1 with a surface on which the ELO mask 5 as an electrode is formed, for example, and a region in the vicinity of an interface contacting the electrode is a dislocation-free region, for example, thereby fulfilling excellent semiconductor characteristics. According to one embodiment of the disclosure, after the mask 5 is used for formation of the crystal growth layer 8, the ELO mask 5 becomes available as an electrode (for example, an Ohmic electrode) of a semiconductor device.

Another embodiment of a manufacturing method of the disclosure will be explained using FIGS. 15-*a* to 16-*b*. A crystalline base 110 includes a crystal substrate 1 and a crystal layer 3 arranged on the crystal substrate. Crystal growth of a first crystal growth layer 120 is caused on the crystal substrate 1 with a surface on which the crystal layer 3 and a mask layer (ELO mask) 2 are formed, thereby obtaining a multilayer structure illustrated in FIG. 15-*a*. Here, an m-plane sapphire substrate is used as the crystal substrate 1 and α-Ga$_2$O$_3$ is used as the crystal layer 3 (buffer layer). Furthermore, mask layers 2 extending lengthwise in directions conforming to a c-axis direction, for example, are arranged at a constant interval on an upper surface of the crystalline base 110 (a crystal growth surface and corresponding to an upper surface of a buffer layer in this case), and the crystal growth layer 120 is formed. Causing crystal growth under the above-descried conditions causes dislocation to extend in an m-axis direction from the upper surface of the crystalline base, thereby allowing the dislocation starting to extend toward the m-axis direction in FIG. 15-*a* to be bent toward an a-axis direction to achieve focusing of the dislocation. As the crystal is laterally grown on the mask layer 2, dislocation density in a crystal growth region 120B is lower than dislocation density in a crystal growth region 120A. Next, an upper surface 120*a* of the first crystal growth layer 120 is polished, for example, to become a flat surface. This removes a part of the crystal growth region 120A of high dislocation density having been focused in the a-axis direction. Next, as illustrated in FIG. 15-*b*, crystal growth continues on the flat upper surface 120*a* of the first crystal growth layer 120 to form a second crystal growth layer 130, thereby obtaining a multilayer structure in FIG. 15-*b*. The crystal growth region 120B in the first crystal growth layer 120 located on the mask layer 2 is a favorable crystal growth region of low dislocation density including the ELO growth. Furthermore, the region of high dislocation density having been focused in a certain direction is removed. As a result, it becomes possible to obtain a crystal film in which the second crystal growth layer 130 of lower dislocation density than the first crystal growth layer 120 is formed on the first crystal growth layer 120. Dislocation density in a crystal growth region 130B in the second growth layer 130 located over the mask layer 2 is allowed to be lower than dislocation density in the crystal growth region 120B in the first growth layer 120 located over the mask layer 2.

As illustrated in FIG. 16-*a*, for example, after formation of the required crystal growth layers, the crystalline base 110 is removable. As described above, the crystalline base may be a crystal substrate, or may include a crystal substrate and a crystal layer (may be a plurality of layers) arranged on the crystal substrate. According to an embodiment of a manufacturing method of the disclosure, at least the crystal substrate is removed. According to an embodiment, a crystal substrate and a crystal layer arranged on the crystal substrate may be removed. Moreover, depending on a material of the mask layer 2, not only the crystalline base but also the mask may be removed as illustrated in FIG. 17-*a* if it is not required to be a part of a completed semiconductor device. As illustrated in FIG. 16-*a*, a first crystal growth layer and a second crystal growth layer may be diced along a line XVIb-XVIb, for example. By doing so, it becomes possible to obtain a plurality of multilayer structures from a crystal film formed into a large area each including a semiconductor film and an electrode arranged on the semiconductor film included in a semiconductor device. To obtain a plurality of the multilayer structures, the crystal film may be formed into a large area and diced vertically and horizontally. Alternatively, a method of forming crystal films into respective required areas and not performing dicing for separation may be employed.

As one embodiment, crystal growth of an n$^+$-type α-Ga$_2$O$_3$ layer as the first crystal growth layer 120 is caused, for example, on the crystalline base 110 on which the mask layer 2 is arranged as described above. After the upper surface of the first crystal growth layer 120 in which dislocation is focused is removed to flatten the first crystal growth layer 120, crystal growth of an n$^-$-type α-Ga$_2$O$_3$ layer is caused at a lower dopant concentration than a concentration at the time of formation of the first crystal growth layer 120, thereby forming the second crystal growth layer 130. By using the mask layer 2 containing an electrode material as an Ohmic electrode, for example, it becomes possible to obtain a multilayer structure such as that illustrated in FIG. 16-*b* including a semiconductor film with an Ohmic junction region and an Ohmic electrode arranged on the Ohmic junction region. The semiconductor film includes the n$^-$-type α-Ga$_2$O$_3$ layer as a first semiconductor layer 13 and the n$^+$-type α-Ga$_2$O$_3$ layer as a second semiconductor layer 12. By using a mask arranged in contact with and on the second semiconductor layer 12 as an Ohmic electrode, a Schottky electrode may further be formed on the first semiconductor layer 13 using a publicly-known electrode forming method. Forming the electrode in this way achieves increased adhesion between the electrode and the semiconductor film, thereby obtaining a semiconductor device 100 such as that illustrated in FIG. 13.

Figure 13:
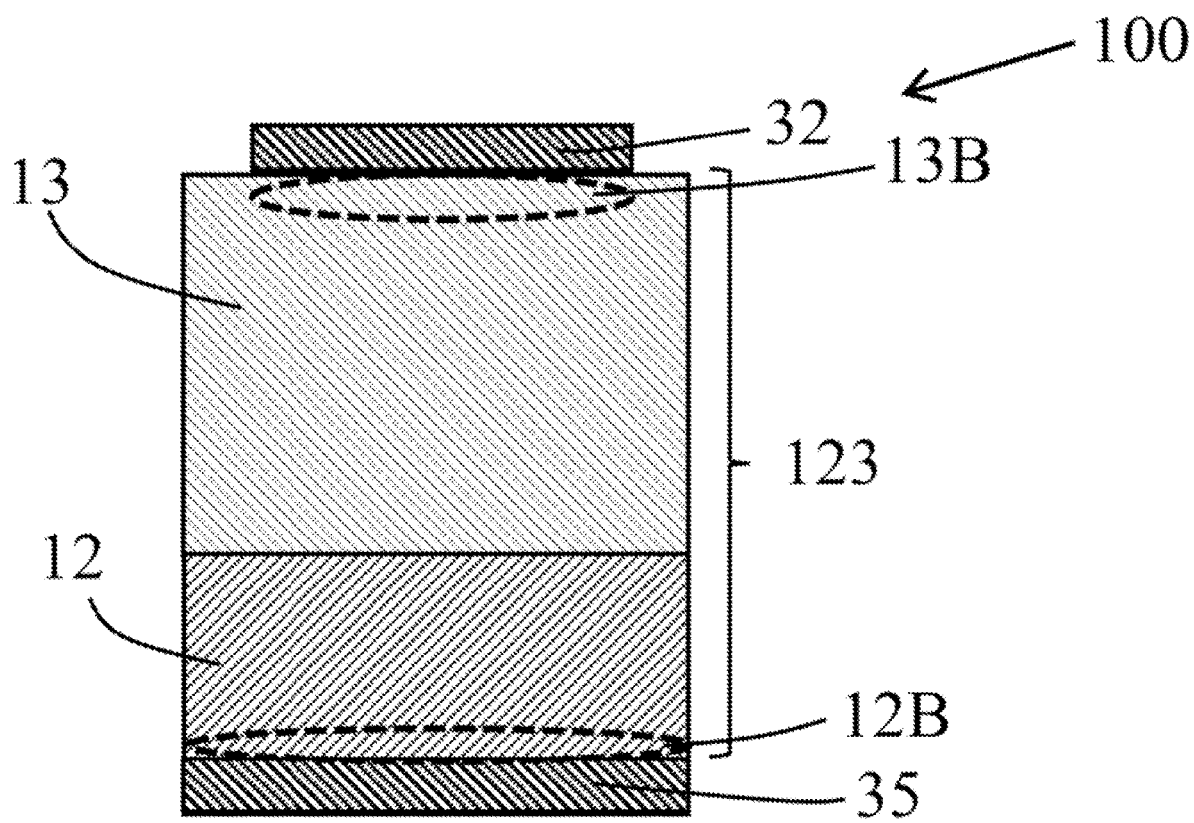
FIG. 13 illustrates a sectional view of a semiconductor device (SBD) as an embodiment of the disclosure.

The semiconductor device 100 illustrated in FIG. 13 is an SBD, for example, and includes: a semiconductor film 123 including a Schottky junction region 13B and an Ohmic junction region 12B; a Schottky electrode 32 arranged on the Schottky junction region 13B in the semiconductor film 123; and an Ohmic electrode 35 arranged on the Ohmic junction region 12B. According to an embodiment of a semiconductor device of the disclosure, dislocation density in the Schottky junction region 13B in the semiconductor film 123 is lower than dislocation density in the Ohmic junction region 12B in the semiconductor film 123. This makes it possible to form a Schottky junction region in a region of favorable crystallinity. Here, the Schottky junction region 13B is a region in the semiconductor film 123 at a distance of equal to or less than 100 nm from an interface between the semiconductor film 123 and the Schottky electrode 32, for example. Also, the Ohmic junction region 12B is a region in the semiconductor film 123 at a distance of equal to or less than 100 nm from an interface between the semiconductor film 123 and the Ohmic electrode 35, for example. According to an embodiment of the disclosure, the semiconductor film 123 preferably includes a first semiconductor layer 13 forming a Schottky junction with the Schottky electrode 32, and a second semiconductor layer 12 forming an Ohmic junction with the Ohmic electrode 35. According to an embodiment of the disclosure, it is preferable that dislocation density in the first semiconductor layer 13 is lower than dislocation density in the second semiconductor layer 12.

Figure 14:
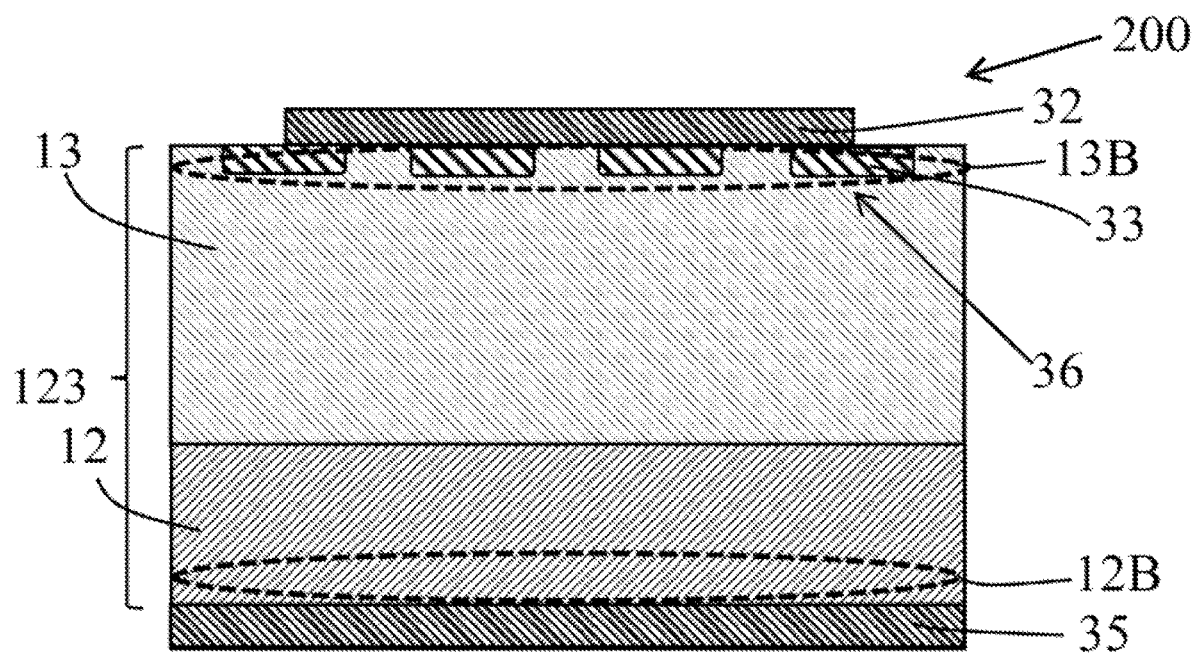
FIG. 14 illustrates a sectional view of a semiconductor device (JBS) as an embodiment of the disclosure.

A semiconductor device 200 illustrated in FIG. 14 is a JBS, for example, and includes: a semiconductor film 123 including a Schottky junction region 13B and an Ohmic junction region 12B; a Schottky electrode 32 arranged on the Schottky junction region 13B in the semiconductor film 123; and an Ohmic electrode 35 arranged on the Ohmic junction region 12B. After obtaining a multilayer structure such as that illustrated in FIG. 16-*b* or 17-*b* by the above-described method of manufacturing a semiconductor device, for example, a plurality of trenches 36 is formed in the Schottky junction region in a first semiconductor layer 13. As one embodiment of the JBS, a p-type semiconductor region 33 may be formed by being embedded in the trench 36. The trench 36 may be formed by etching the first semiconductor layer 13 selectively by etching, for example. This etching may be performed using mist CVD method. A p-type semiconductor region may be formed in the trench using mist CVD method, for example. As another embodiment of the JBS, a dielectric layer may be formed in the trench 36 and a semiconductor region may be embedded in the trench across the dielectric layer. An embodiment of a method of manufacturing a semiconductor device of the disclosure makes it possible to form a Schottky junction region in a region of favorable crystallinity. According to the embodiment, it is possible to obtain a semiconductor device of favorable semiconductor characteristics by providing the Schottky junction region with a p-type semiconductor region embedded in a plurality of trenches.

Figure 18:
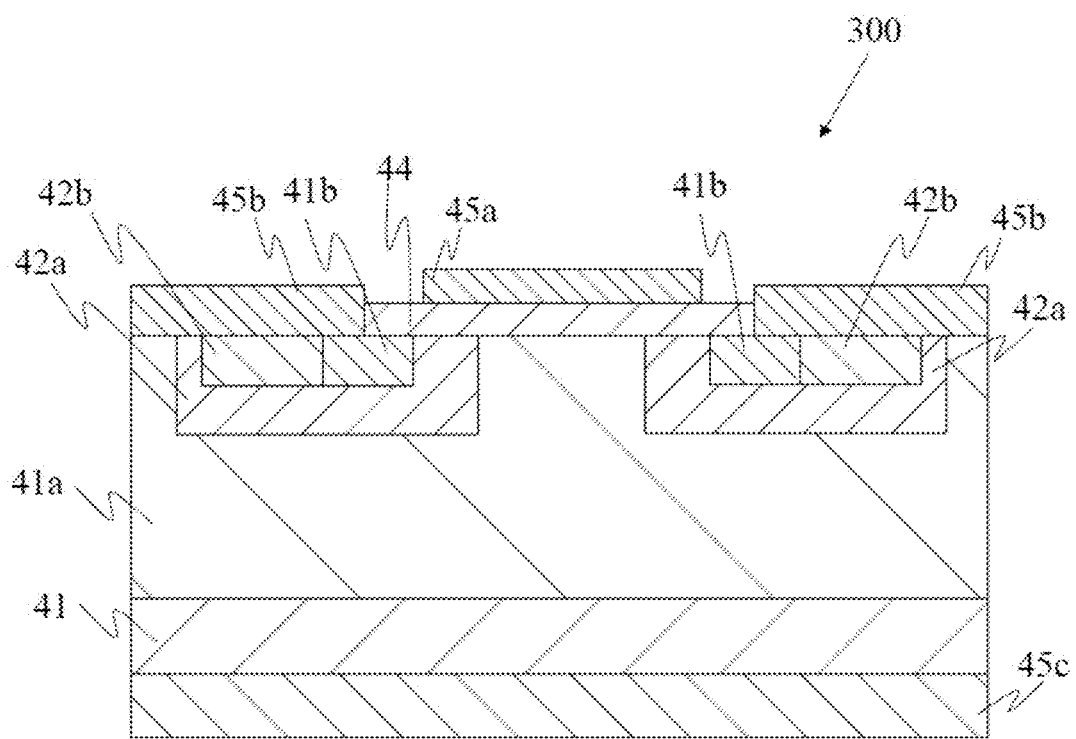
FIG. 18 illustrates a sectional view of a Metal Oxide Semiconductor Field Effect Transistor (MOSFET) as an embodiment of the disclosure.

A semiconductor device 300 illustrated in FIG. 18 is a MOSFET, for example, and includes: an n+-type semiconductor layer 41, an n--type semiconductor layer 41*a*, a p-type semiconductor layer (a channel layer) 42*a*, a p+-type semiconductor layer 42*b*, an n+-type semiconductor layer 41*b*, a gate insulating film 44, a gate electrode 45*a*, a source electrode 45*b*, a drain electrode 45*c*. The manufacturing method according to an embodiment of a semiconductor device of the disclosure enables to make the semiconductor device 300 in which a first dislocation density of the p-type semiconductor (the channel layer) 42*a* is smaller than a second dislocation density of the n+-type semiconductor layer 41. According to an embodiment of the disclosure, as also apparent from the FIG. 10 and FIG. 11, the channel layer 42*a* is arranged along with a direction of m-axis or a direction of a-axis, preferably along with the direction of a-axis. In other word, a channel current preferably flows at least in a direction of m-axis or a direction of a-axis, more preferably at a direction of a-axis.

As described above, according to an embodiment of a semiconductor device of the disclosure, an ELO mask may contain an electrode material. Using an ELO mask such as that described above makes it possible to easily obtain a semiconductor device, particularly, an SBD with a favorable drift layer or a favorable Schottky interface, etc. Examples of the electrode material include metals and alloys containing two or more types of the metals, conductive films of metal oxides such as tin oxide, zinc oxide, rhenium oxide, indium oxide, indium tin oxide (ITO), and indium zinc oxide (IZO), organic conductive compounds such as polyaniline, polythiophene, and polypyrrole, and mixtures thereof. According to the disclosure, the metal is preferred. Preferably, the metal is at least one type of metal selected from Group 4 to Group 10 of the periodic table, for example. Examples of metal in Group 4 of the periodic table include titanium (Ti), zirconium (Zr), and hafnium (Hf). Examples of metal in Group 5 of the periodic table include vanadium (V), niobium (Nb), and tantalum (Ta). Examples of metal in Group 6 of the periodic table include chromium (Cr), molybdenum (Mo), and tungsten (W). Examples of metal in Group 7 of the periodic table include manganese (Mn), technetium (Tc), and rhenium (Re). Examples of metal in Group 8 of the periodic table include iron (Fe), ruthenium (Ru), and osmium (Os). Examples of metal in Group 9 of the periodic table include cobalt (Co), rhodium (Rh), and iridium (Ir). Examples of metal in Group 10 of the periodic table include nickel (Ni), palladium (Pd), and platinum (Pt). A method of forming the electrode is not particularly limited. The electrode may be formed on the crystalline base by following a method appropriately selected in consideration of compatibility with the material mentioned above from wet method such as printing, spraying, or coating, physical method such as vacuum evaporation, sputtering, or ion plating, and chemical method such as CVD or plasma CVD, for example.

According to another embodiment of the disclosure, the ELO mask preferably includes a gate electrode. Covering the gate electrode with the ELO mask as a gate insulating film makes it possible to easily obtain an excellent semiconductor device, particularly, an excellent MOSFET.

The above-described multilayer structure is preferably usable, particularly in a semiconductor device including at least an electrode and a semiconductor layer, and is particularly useful for power devices. The semiconductor device may be a transistor such as an SBD, an MOSFET, an MIS, or an HEMT, a TFT, a Schottky barrier diode using a semiconductor-metal junction, a PN or PIN diode using a combination with another P layer, or a light emitting and receiving element.

Figure 8:
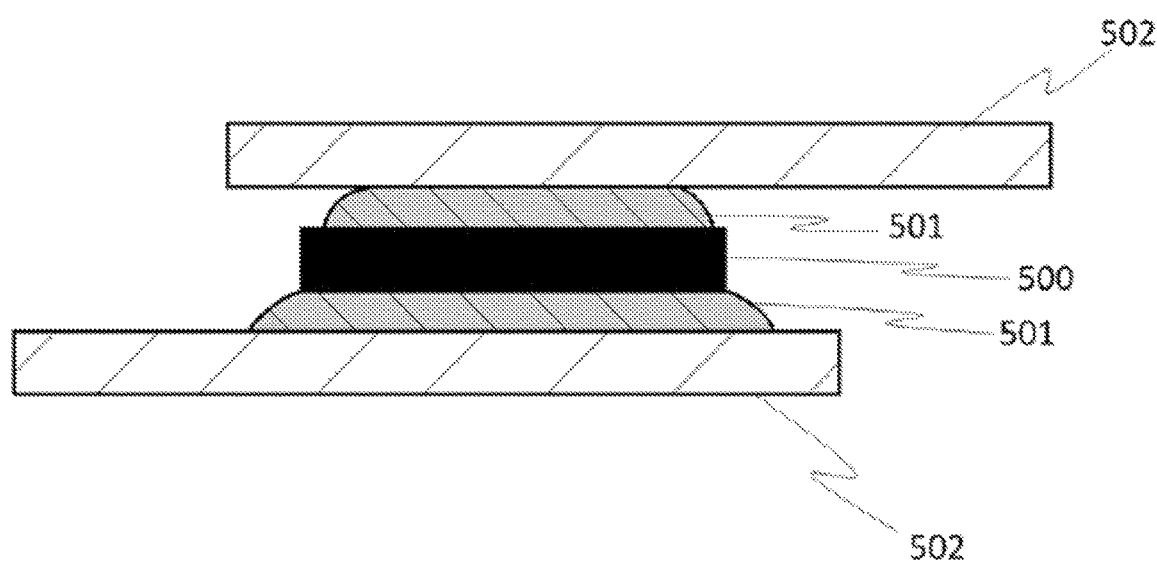
FIG. 8 is a view schematically illustrating an example of a semiconductor device joined to a lead frame, a circuit board, or a heat dissipation substrate.

Regarding the semiconductor device according to an embodiment of the disclosure and/or in addition to the matters described above, the semiconductor device becomes preferably usable as a semiconductor device by being joined with a joint member to a lead frame, a circuit board, or a heat dissipation substrate, for example, on the basis of a common method. In particular, the semiconductor device is preferably used for a power module, an inverter, or a converter, and is further used preferably for a semiconductor system using a power source device, for example. FIG. 8 illustrates a preferred example of the semiconductor device joined to a lead frame, a circuit board, or a heat dissipation substrate. In the semiconductor device in FIG. 8, each of both surfaces of a semiconductor element 500 is joined with a solder 501 to a lead frame, circuit board, or heat dissipation substrate 502. Such a configuration achieves a semiconductor device with excellent heat dissipation performance. According to the disclosure, it is preferable to seal the periphery of a joint member such as a solder with resin.

Figure 5:
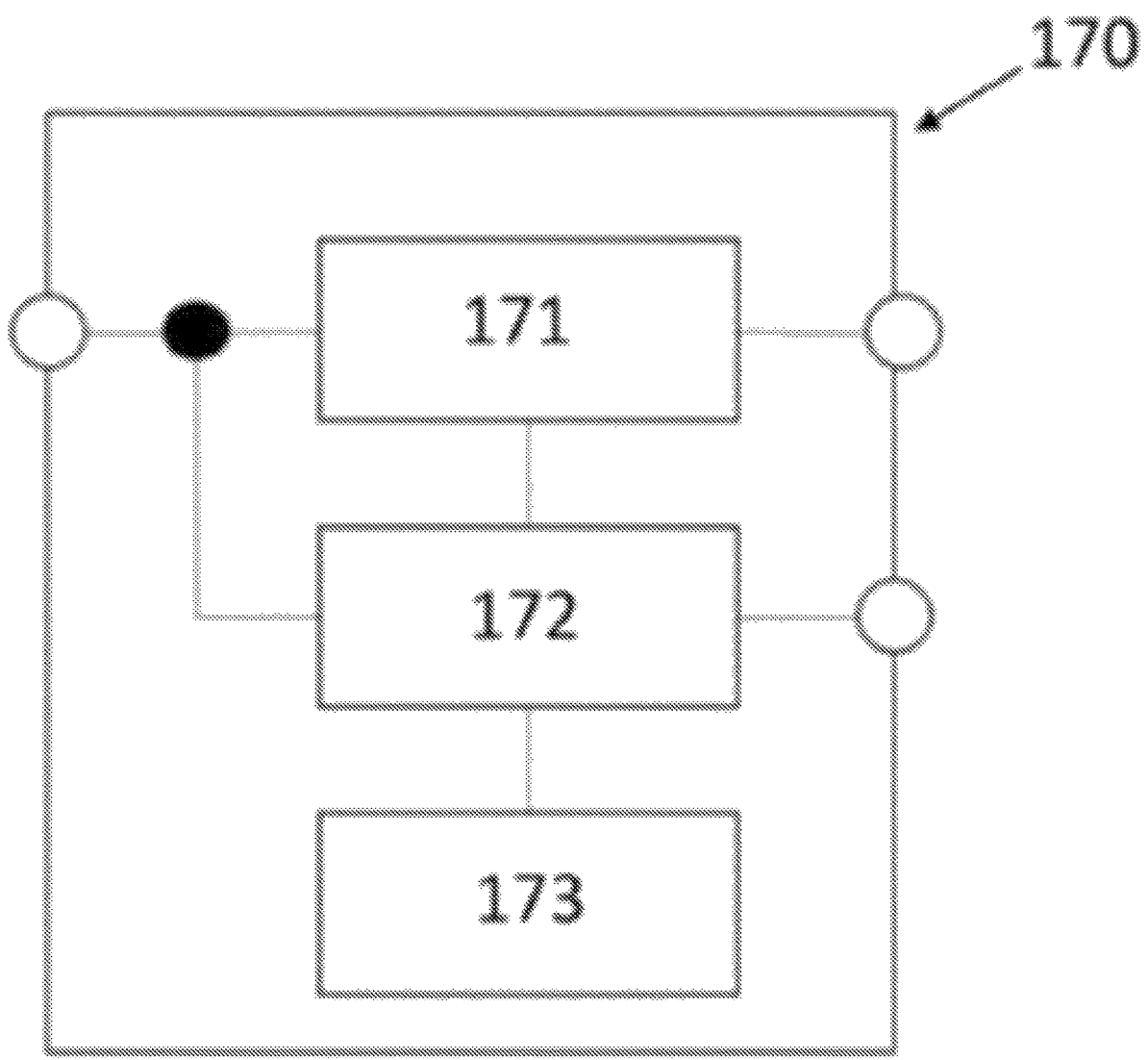
FIG. 5 is a view schematically illustrating an example of a power source system.
Figure 6:
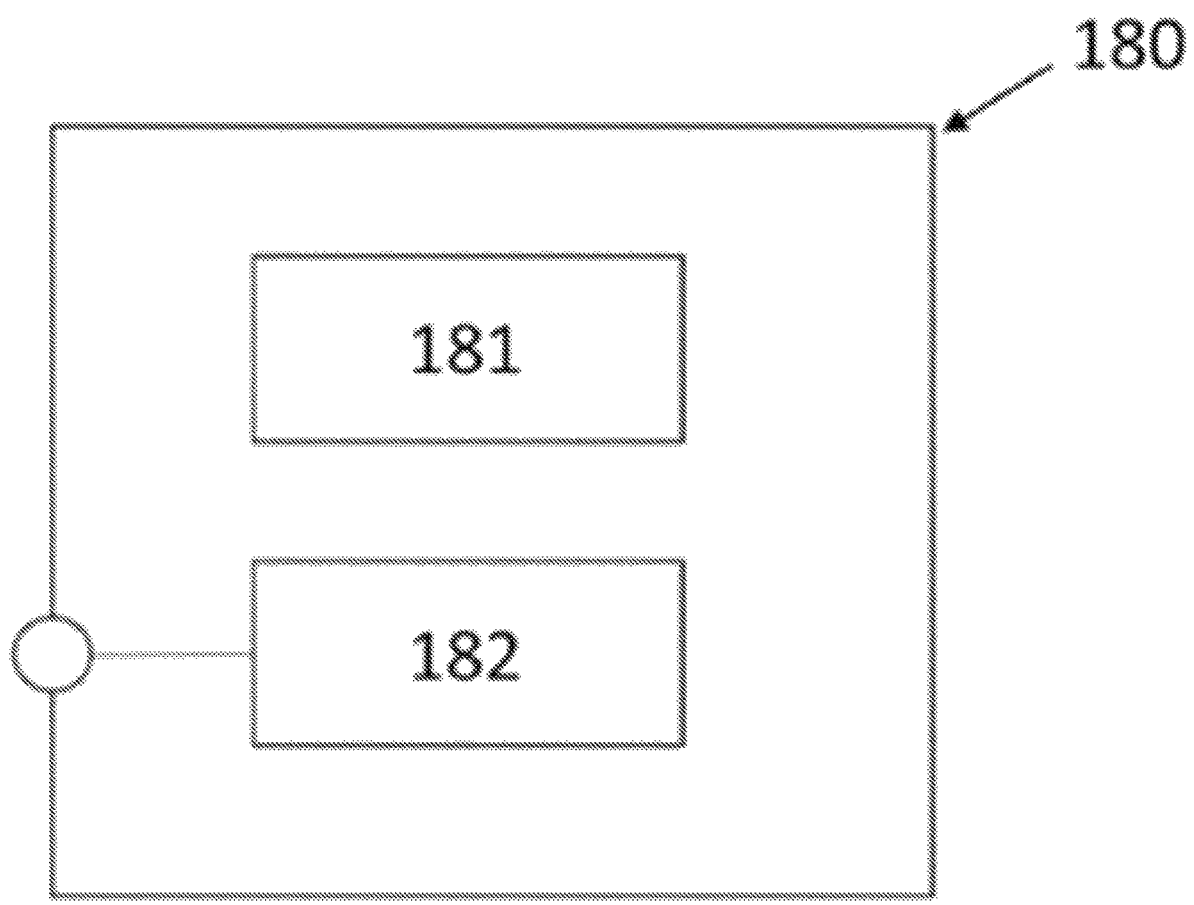
FIG. 6 is a view schematically illustrating an example of a system device.
Figure 7:
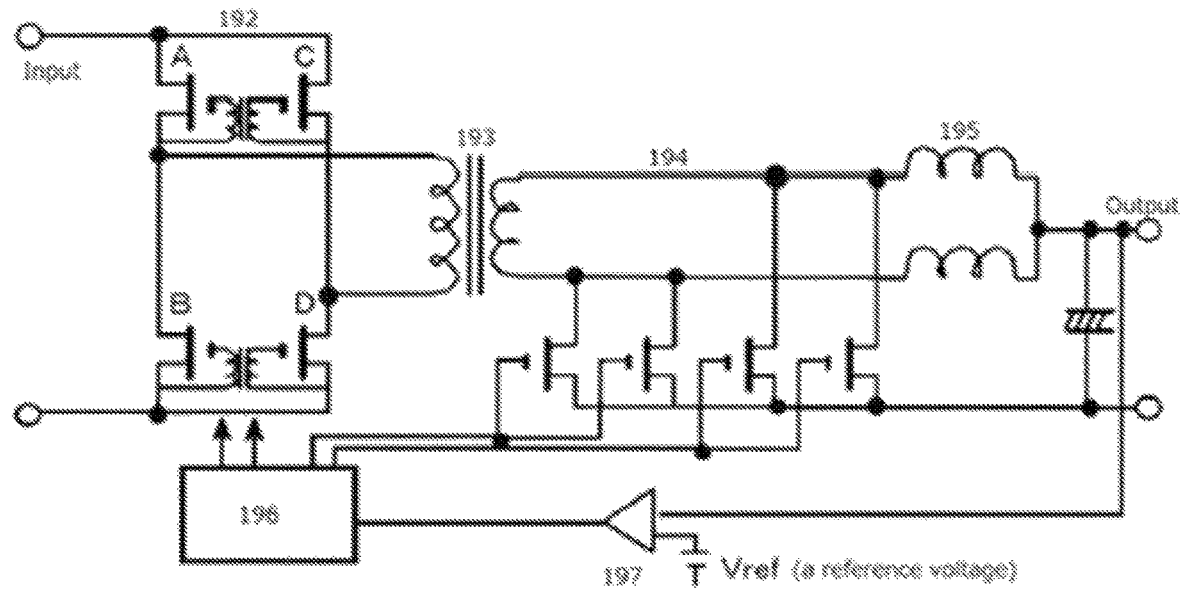
FIG. 7 is a view schematically illustrating an example of a power source circuit diagram of a power source device.

The power source device may be provided from the semiconductor device or may be provided as a power source device including the semiconductor device by being connected to a wiring pattern, for example, using a publicly-known method. In FIG. 5, a power source system 170 is configured using a plurality of such power source devices 171 and 172 and a control circuit 173. As illustrated in FIG. 6, the power source system is usable in a system device 180 including an electronic circuit 181 and a power source system 182 in combination. FIG. 7 illustrates an example of a power source circuit diagram of the power source device. FIG. 7 illustrates a power source circuit of a power source device including a power circuit and a control circuit. A DC voltage is switched and converted to AC at a high frequency by an inverter 192 (composed of MOSFETs A to D), and is then subjected to insulation and transformation by a transformer 193. The voltage is then rectified by a rectification MOSFET 194 and then smoothed by a DCL 195 (smoothing coils L1 and L2) and a capacitor to output a direct current voltage. At this point, the output voltage is compared with a reference voltage by a voltage comparator 197 to control the inverter 192 and the rectification MOSFET 194 using a PWM control circuit 196 so as to obtain a desired output voltage.

Figure 9:
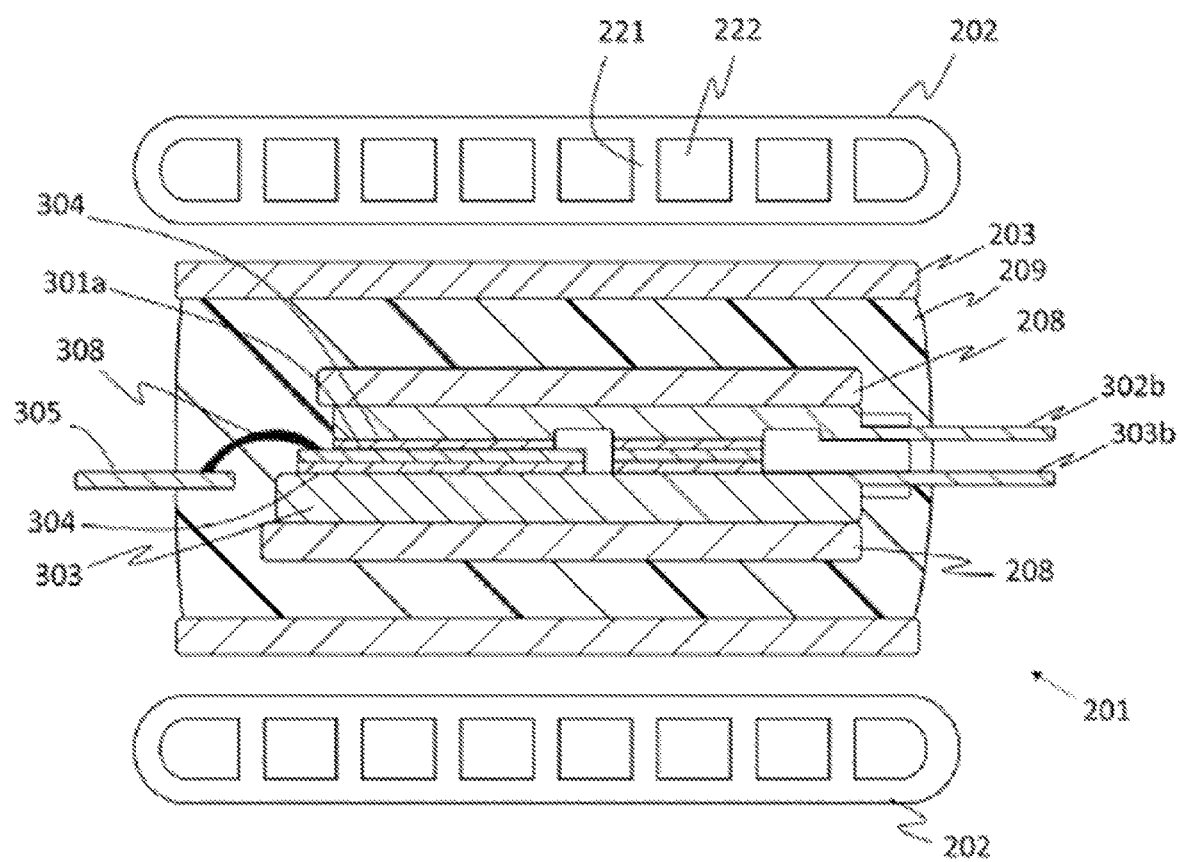
FIG. 9 is a view schematically illustrating an example of a power card.

According to the disclosure, the semiconductor device is preferably a power card. More preferably, the power card includes a cooler and an insulating member and the cooler is provided on each of both sides of the semiconductor layer across at least the insulating member. Most preferably, a heat dissipation layer is provided on each of the both sides of the semiconductor layer and the cooler is provided external to the heat dissipation layer across at least the insulating member. FIG. 9 illustrates a power card as one preferred embodiment of the disclosure. The power card in FIG. 9 is a double-sided cooling power card 201 including a coolant tube 202, a spacer 203, an insulating plate (insulating spacer) 208, a resin sealing part 209, a semiconductor chip 301a, a metal heat transfer plate (projecting terminal part) 302b, a heat sink and electrode 303, a metal heat transfer plate (projecting terminal part) 303b, a solder layer 304, a control electrode terminal 305, and a bonding wire 308. The coolant tube 202 has a section in a thickness direction provided with a large number of flow paths 222 partitioned by a large number of partitions 221 arranged at certain intervals therebetween and extending in a flow path direction. This preferred power card achieves higher heat dissipation performance and fulfills higher reliability.

The semiconductor chip 301a is joined to an inner principal plane of the metal heat transfer plate 302b with the solder layer 304. The metal heat transfer plate (projecting terminal part) 302b is joined to the residual principal plane of the semiconductor chip 301a with the solder layer 304. By doing so, an anode electrode surface and a cathode electrode surface of a flywheel diode are connected in so-called inverse-parallel to a collector electrode surface and an emitter electrode surface of an IGBT. The metal heat transfer plates (projecting terminal parts) 302b and 303b are made of a material that is Mo or W, for example. The metal heat transfer plates (projecting terminal parts) 302b and 303b have a difference in thickness with which a difference in thickness of the semiconductor chip 301a is absorbed to define outer surfaces of the metal heat transfer plates 302b and 303b as flat surfaces.

The resin sealing part 209 is made of epoxy resin, for example, and is molded while covering side surfaces of the metal heat transfer plates 302b and 303b. The semiconductor chip 301a is molded with the resin sealing part 209. Outer principal planes, namely, heat-receiving contact surfaces of the metal heat transfer plates 302b and 303b are completely exposed. The metal heat transfer plates (projecting terminal parts) 302b and 303b project rightward from the resin sealing part 209 in FIG. 9. The control electrode terminal 305 that is a so-called lead frame terminal forms connection between a gate (control) electrode surface and the control electrode terminal 305 of the semiconductor chip 301a where an IGBT is formed, for example.

While the insulating plate 208 as an insulating spacer is composed of an aluminum nitride film, for example, it may be a different insulating film. The insulating plate 208 tightly contacts the metal heat transfer plates 302b and 303b while covering the metal heat transfer plates 302b and 303b completely. Alternatively, the insulating plate 208 may simply contact the metal heat transfer plates 302b and 303b, or a member to transfer heat favorably such as silicone grease may be applied. Various methods are applicable to form a joint therebetween. An insulating layer may be formed by ceramic spraying, for example. The insulating plate 208 may be joined onto the metal heat transfer plate or may be joined onto or formed on the coolant tube.

The coolant tube 202 is prepared by cutting a plate material formed by pultrusion molding or extrusion molding on an aluminum alloy into a required length. The section in a thickness direction of the coolant tube 202 includes the large number of flow paths 222 partitioned by the large number of partitions 221 arranged at certain intervals therebetween and extending in the flow path direction. The spacer 203 may be a soft metal plate such as a solder alloy, for example. The spacer 203 may also be a film (coating) formed on the contact surfaces of the metal heat transfer plates 302b and 303b by coating, for example. The soft spacer 203 has a surface that is easy to deform and is adaptable to fine irregularities or distortion of the insulating plate 208 and to fine irregularities or distortion of the coolant tube 202, thereby reducing thermal resistance. A publicly-known member to transfer heat favorably such as grease may be applied, for example to a surface of the spacer 203. The spacer 203 is omissible.

EXAMPLES

Example

1. Production of Semiconductor Device

As a substrate for crystal growth, a crystalline base including an m-plane sapphire substrate and a buffer layer arranged on at least a part of the m-plane sapphire substrate is used. An ELO mask extending in a c-axis direction is formed on a surface of the base into a stripe shape relative to a crystal growth surface. The ELO mask may be prepared using an electrode material or using an insulator material depending on the purpose of a semiconductor device. According to the embodiment, as an example of a mask material, an $SiO_2$ film was used. As illustrated in FIG. 15-a, a crystalline base 110 includes a crystal substrate 1 and a crystal layer 3 arranged on the crystal substrate 1, and a crystal layer 3 ($\alpha$-$Ga_2O_3$ film) arranged on an m-plane of the sapphire substrate was provided as a buffer layer. An ELO mask 5 having a strip pattern is formed on the crystal growth surface of the crystalline base. A lengthwise direction of the ELO mask 5 was defined in a c-axis direction. As illustrated in FIG. 15-a, by using the above-described substrate for crystal growth, a first crystal growth layer 120 made of α-$Ga_2O_3$ is formed by mist CVD method to obtain a multilayer structure. After the multilayer structure (c) is obtained, publicly-known means is employed to form an electrode, etc., thereby obtaining a semiconductor device. The semiconductor device obtained in this way has excellent adhesion between the ELO mask and the crystal growth layer (semiconductor layer). Furthermore, as a favorable crystal region is formed at an interface between the semiconductor layer and the mask, the semiconductor device fulfills excellent semiconductor characteristics.

2. Evaluation

The semiconductor device obtained in the above paragraph 1. was observed under a TEM. FIG. 10 illustrates result thereof. FIG. 10 shows that excellent adhesion is achieved without a void, etc. between the ELO mask and the crystal growth layer (semiconductor layer). FIG. 10 further shows that a favorable crystal region is formed on the ELO mask.

INDUSTRIAL APPLICABILITY

The semiconductor device according to the disclosure is available in any field including semiconductors (e.g., compound semiconductor electronic devices), electronic parts, electric equipment parts, optical electrophotographic related apparatuses, industrial members, and especially useful for power devices.

The embodiments of the present invention are exemplified in all respects, and the scope of the present invention includes all modifications within the meaning and scope equivalent to the scope of claims.

REFERENCE SIGNS LIST

1 Substrate (sapphire substrate)
1a Substrate surface (crystal growth surface)
2 Mask (ELO Mask)
2a Projection
3 Crystal layer (buffer layer)
5 ELO Mask (on substrate)
8 Crystal growth layer (semiconductor layer)
11 Substrate
12 Second semiconductor layer
12B Ohmic junction region
13 First semiconductor layer
13B Schottky junction region
14 Electrode (gate electrode)
15 Dielectric film (gate insulating film)
18 Semiconductor layer (channel layer)
18a N⁻-type semiconductor layer
18b N⁺-type semiconductor layer
19 Mist CVD apparatus
20 Sample for film deposition
21 Sample table
22a Carrier gas source
22b Carrier gas (diluted) source
23a Flow control valve
23b Flow control valve
24 Mist generator
24a Raw material solution
24b Mist
25 Container
25a Water
26 Ultrasonic transducer
27 Deposition chamber
28 Heater
32 Schottky electrode
33 P-type semiconductor region
35 Ohmic electrode
36 Trench
41 N+-type semiconductor layer (drain layer)
41a N--type semiconductor layer (drift layer)
41b N+-type semiconductor layer (source layer)
42a P-type semiconductor layer
42b P+-type semiconductor layer
44 Gate insulating film
45a Gate electrode
45b Source electrode
45c Drain electrode
50 Halide vapor phase epitaxy (HVPE) apparatus
51 Reaction chamber
52a Heater
52b Heater
53a Halogen-containing raw material gas source
53b Metal-containing raw material gas supply tube
54a Reactive gas source
54b Reactive gas supply tube
55a Oxygen-containing raw material gas source
55b Oxygen-containing raw material gas supply tube
56 Substrate holder
57 Metallic source
58 Protective sheet
59 Gas discharge part
100 Semiconductor device
110 Crystalline base
120 First crystal growth layer
120A Crystal growth region of high density of dislocation focused in a-axis direction
120A' After removal of crystal growth region of high density of dislocation focused in a-axis direction
120a Upper surface of first crystal growth layer
120B Crystal growth region in first crystal growth layer 120 located on mask layer 2
123 Semiconductor film
130 Second crystal growth layer
130B Crystal growth region in second crystal growth layer
170 Power source system
171 Power source device
172 Power source device
173 Control circuit
180 System device
181 Electronic circuit
182 Power source system
192 Inverter
193 Transformer
194 Rectification MOSFET
195 DCL
196 PWM control circuit
197 Voltage comparator
200 Semiconductor device
201 Double-sided cooling power card
202 Coolant tube
203 Spacer
208 Insulating plate (insulating spacer)
209 Resin sealing part
221 Partition
222 Flow path
300 Semiconductor device 301a Semiconductor chip
302b Metal heat transfer plate (projecting terminal part)
303 Heat sink and electrode
303b Metal heat transfer plate (projecting terminal part)
304 Solder layer
305 Control electrode terminal
308 Bonding wire
500 Semiconductor element
501 Solder
502 Lead frame, circuit board, or heat dissipation substrate

What is claimed is:

1. A semiconductor device comprising:
a semiconductor film including a Schottky junction region and an Ohmic junction region;
a Schottky electrode arranged on the Schottky junction region; and
an Ohmic electrode arranged on the Ohmic junction region, wherein
the semiconductor film is an oxide containing at least gallium,
the semiconductor film has a corundum structure with a c-axis,
the Schottky junction region has a first dislocation density, and the Ohmic junction region has a second dislocation density,
the first dislocation density is smaller than the second dislocation density, and
the Ohmic electrode extends in a direction of the c-axis.

2. The semiconductor device according to claim 1, wherein
the semiconductor film includes a first semiconductor layer including the Schottky junction region and a second semiconductor layer including the Ohmic junction region.

3. The semiconductor device according to claim 2, wherein
the second semiconductor layer is an n+-type semiconductor layer.

4. The semiconductor device according to claim 2, wherein
the first semiconductor layer is an n−-type semiconductor layer.

5. The semiconductor device according to claim 2, wherein
a principal plane of the semiconductor film is an m-plane.

6. The semiconductor device according to claim 2, wherein
the second semiconductor layer has a corundum structure.

7. The semiconductor device according to claim 2, wherein
the second semiconductor layer contains at least gallium.

8. The semiconductor device according to claim 2, wherein
the first semiconductor layer contains at least gallium.

9. The semiconductor device according to claim 2, wherein
the first semiconductor layer includes a p-type semiconductor region.

10. The semiconductor device according to claim 1, wherein
the semiconductor film includes a lateral growth region.

11. The semiconductor device according to claim 1, wherein
the semiconductor film has a thickness of equal to or greater than 1 μm.

12. The semiconductor device according to claim 1, wherein
the semiconductor device is a power device.

13. A semiconductor system comprising a semiconductor device,
the semiconductor device being the semiconductor device according to claim 1.

14. A semiconductor device comprising:
a semiconductor film including a channel layer and an n+-type semiconductor layer; and
a gate electrode that is arranged directly or via another layer on the channel layer, wherein
the n+-type semiconductor layer has a corundum structure,
the channel layer is arranged along with a direction of an m-axis or a direction of an a-axis,
the channel layer has a first dislocation density,
the n+-type semiconductor layer has a second dislocation density, and
the first dislocation density is smaller than the second dislocation density.

* * * * *